United States Patent
Hu

(10) Patent No.: US 8,928,012 B2
(45) Date of Patent: Jan. 6, 2015

(54) AC LED DEVICE AND ITS MANUFACTURING PROCESS FOR GENERAL LIGHTING APPLICATIONS

(71) Applicant: Jianhua Hu, Palo Alto, CA (US)

(72) Inventor: Jianhua Hu, Palo Alto, CA (US)

( * ) Notice: Subject to any disclaimer, the term of this patent is extended or adjusted under 35 U.S.C. 154(b) by 0 days.

(21) Appl. No.: 13/746,322

(22) Filed: Jan. 22, 2013

(65) Prior Publication Data

US 2013/0214247 A1 Aug. 22, 2013

Related U.S. Application Data

(60) Provisional application No. 61/601,698, filed on Feb. 22, 2012.

(51) Int. Cl.
*H01L 33/00* (2010.01)
*H01L 33/04* (2010.01)
*H01L 27/15* (2006.01)
*H01L 33/38* (2010.01)

(52) U.S. Cl.
CPC .............. *H01L 33/04* (2013.01); *H01L 27/156* (2013.01); *H01L 33/382* (2013.01)
USPC ................................................. 257/88; 257/13

(58) Field of Classification Search
None
See application file for complete search history.

(56) References Cited

U.S. PATENT DOCUMENTS

| 2009/0267085 | A1* | 10/2009 | Lee et al. | 257/88 |
|---|---|---|---|---|
| 2011/0062465 | A1* | 3/2011 | Lee et al. | 257/93 |
| 2011/0140078 | A1* | 6/2011 | Hsu | 257/13 |
| 2011/0297972 | A1* | 12/2011 | Seo et al. | 257/88 |

* cited by examiner

*Primary Examiner* — Julio J Maldonado
*Assistant Examiner* — Joseph Galvin, III

(57) ABSTRACT

The present invention relates to a plurality of light emitting diodes connected in series to elevate the working voltage and to enable the devices to be connected directly to the AC voltage sources. The LED device has five pluralities of series-connected diodes. Four pluralities of series-connected diodes are arranged to at as a rectifier bridge so the fifth plurality of diodes is always forward biased and energized. The light emitting diodes in the device are arranged to accommodate various AC line voltages, diode operating voltages, and diode reverse breakdown voltages. The plurality of diodes was manufactured by first etching epitaxial layer to the insulating substrate to isolate individual diodes, and then use metal lines to interconnect them according to the layout design. The number of die-attach and wire-bonding steps used in the subsequent chip array and lamp manufacturing process is therefore greatly reduced or eliminated. This invention simplifies LED array and lamp process flow, lowers the manufacturing cost, improves product reliability and LED device efficacy.

6 Claims, 34 Drawing Sheets

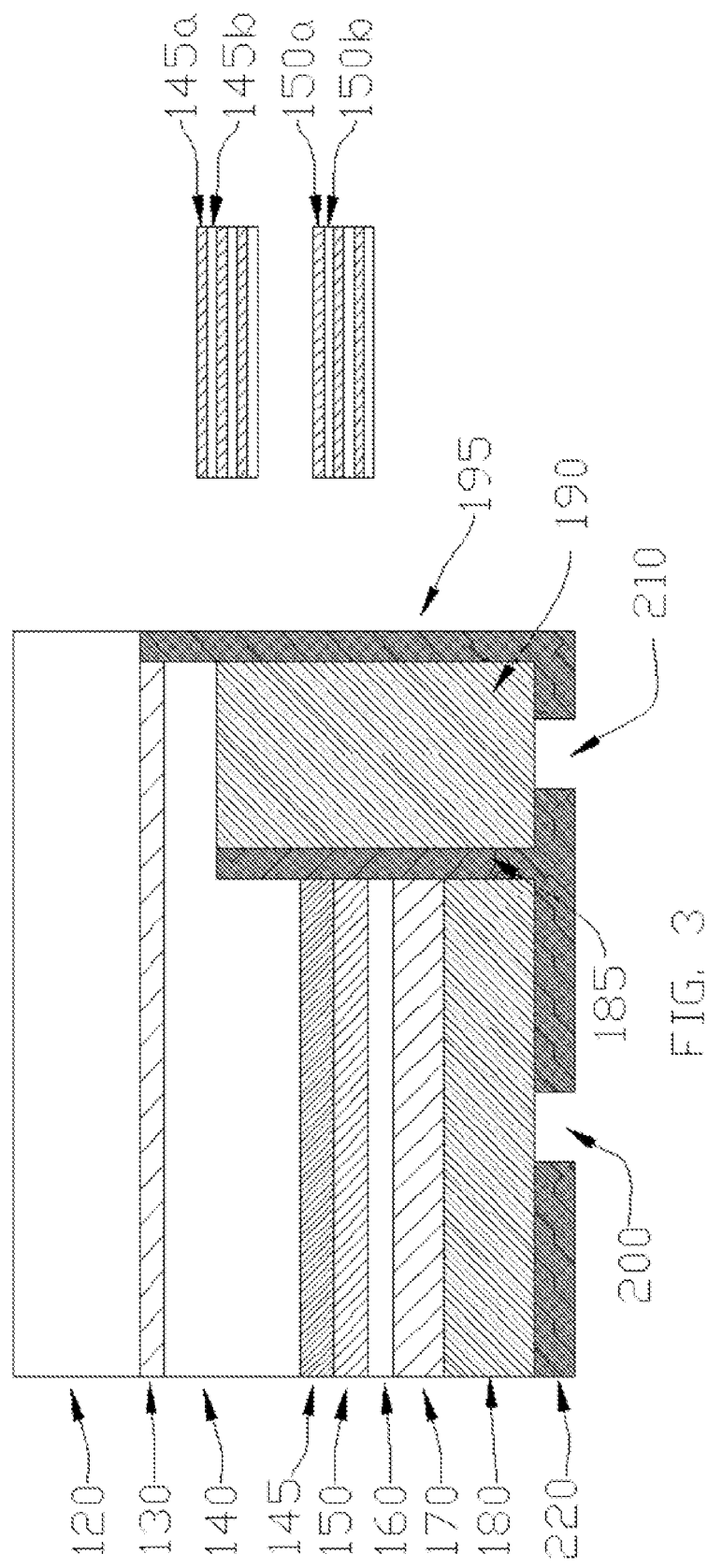

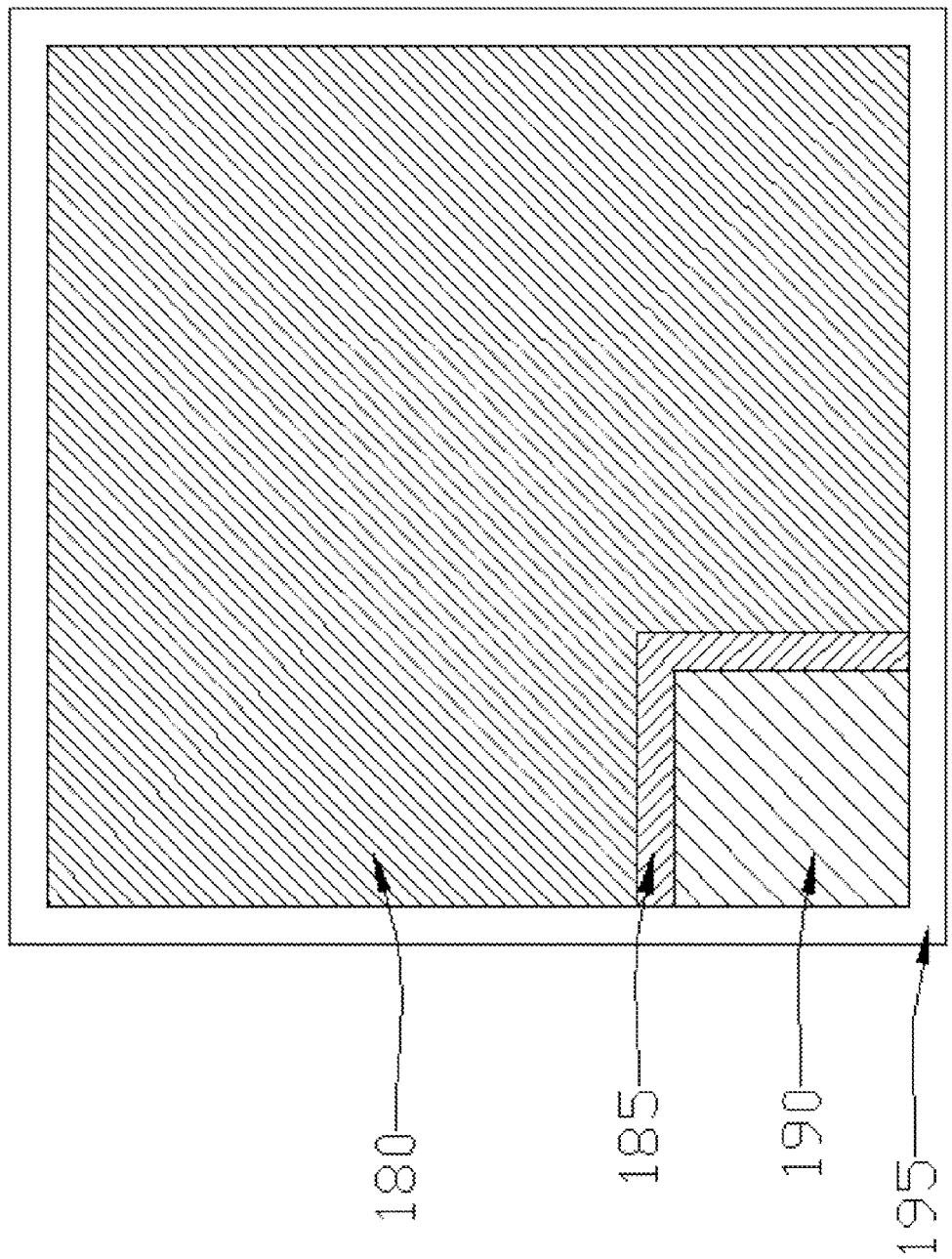

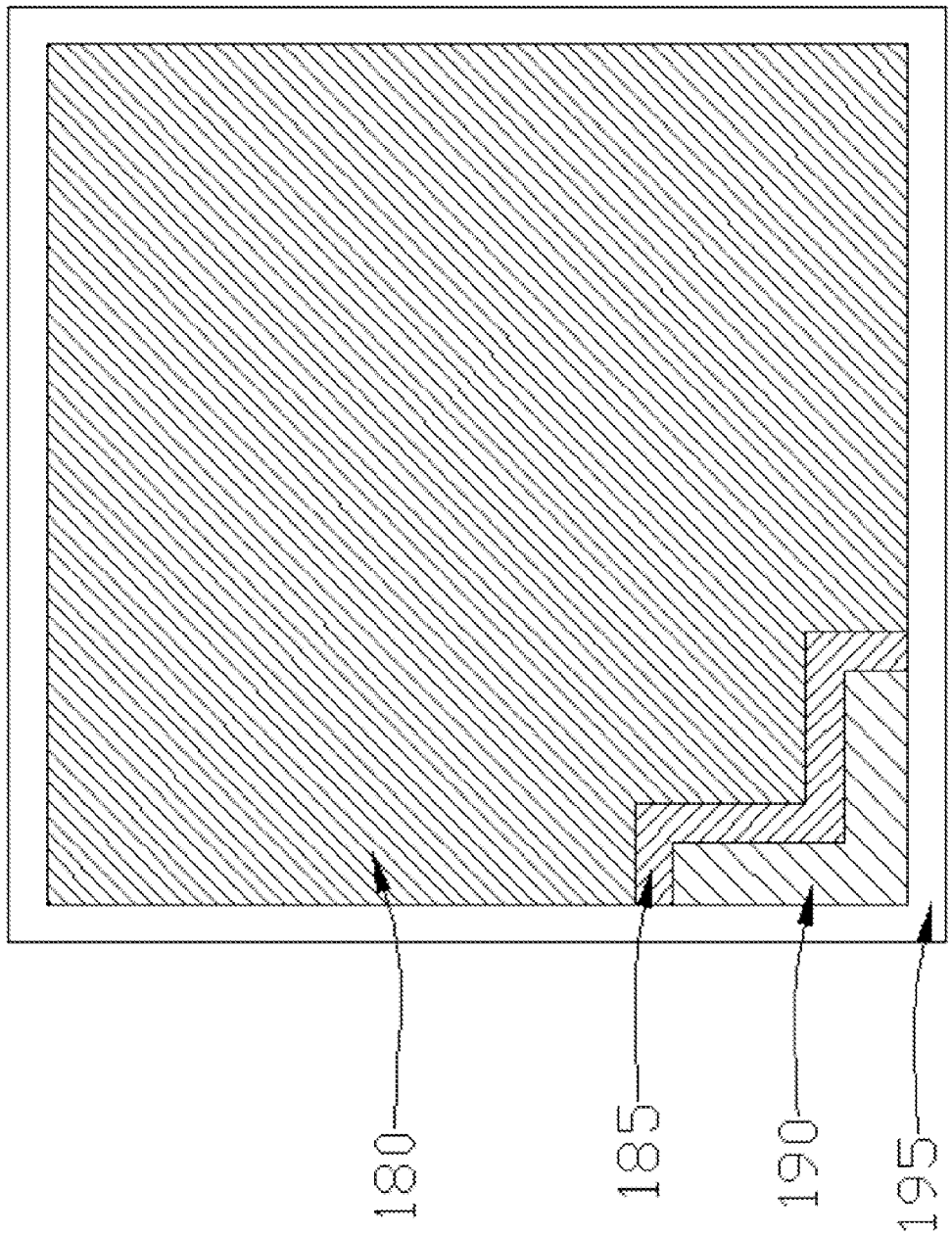

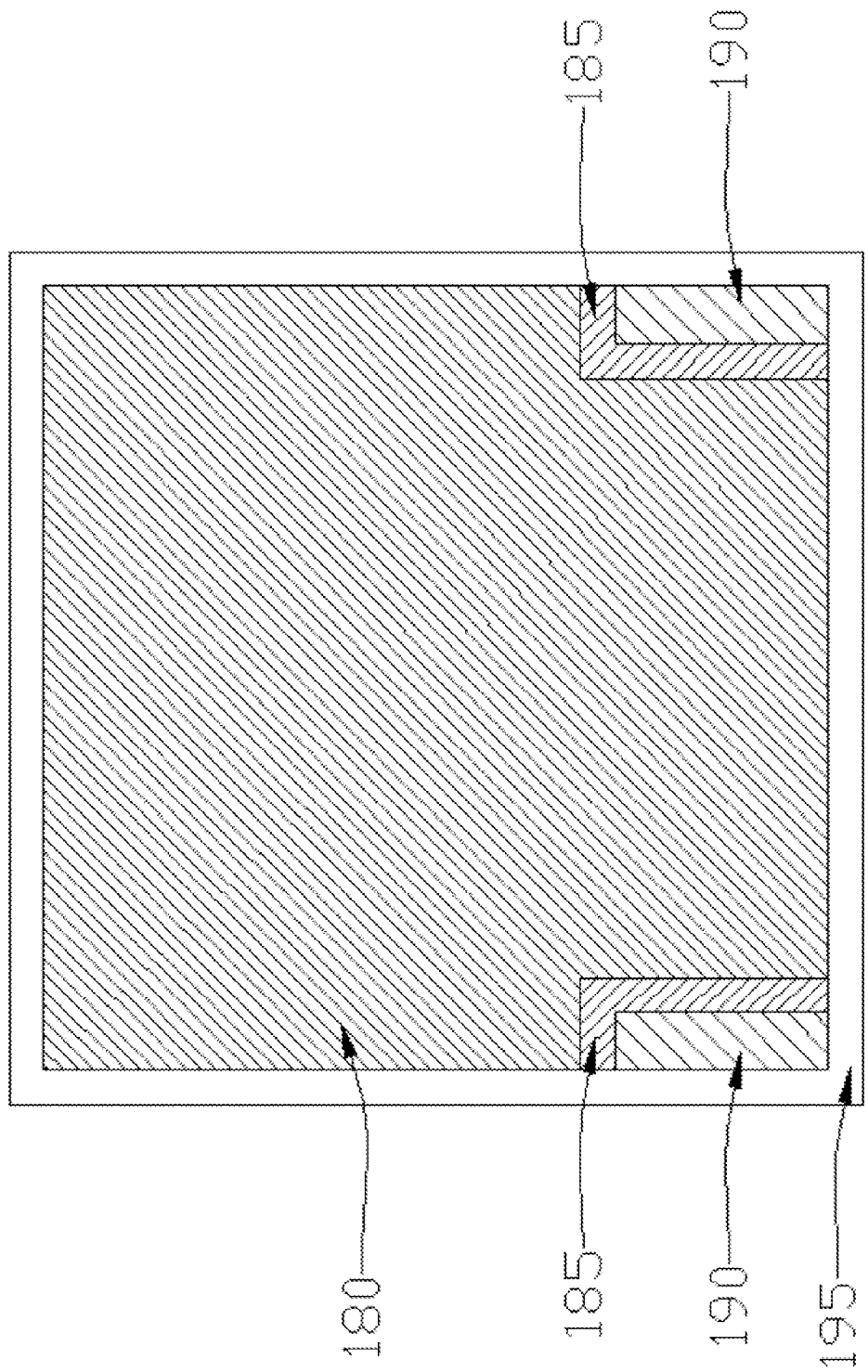

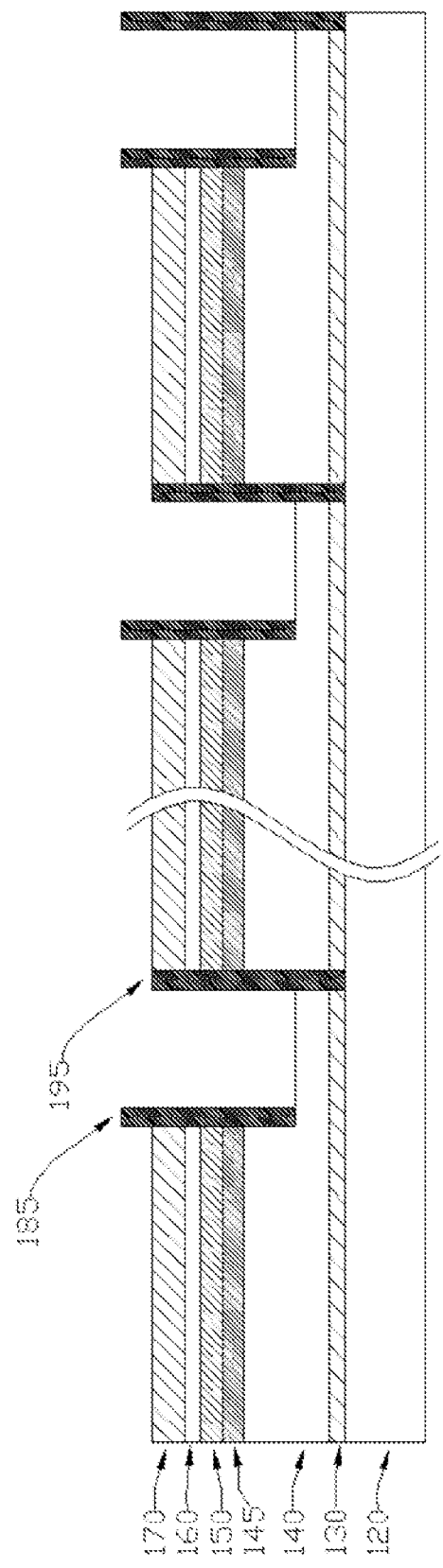

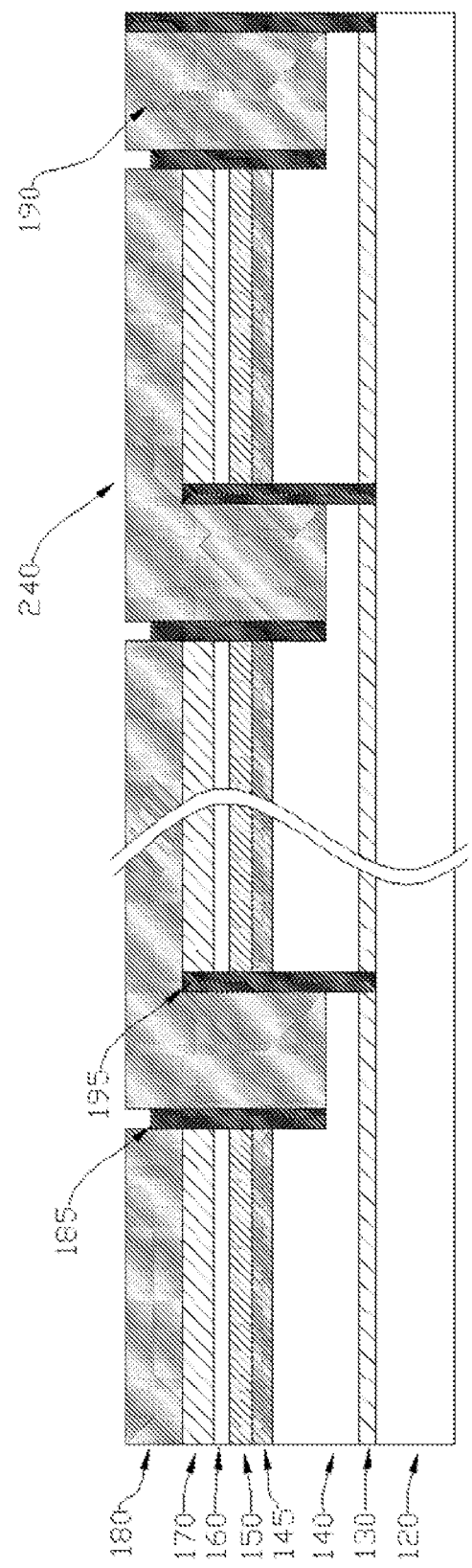

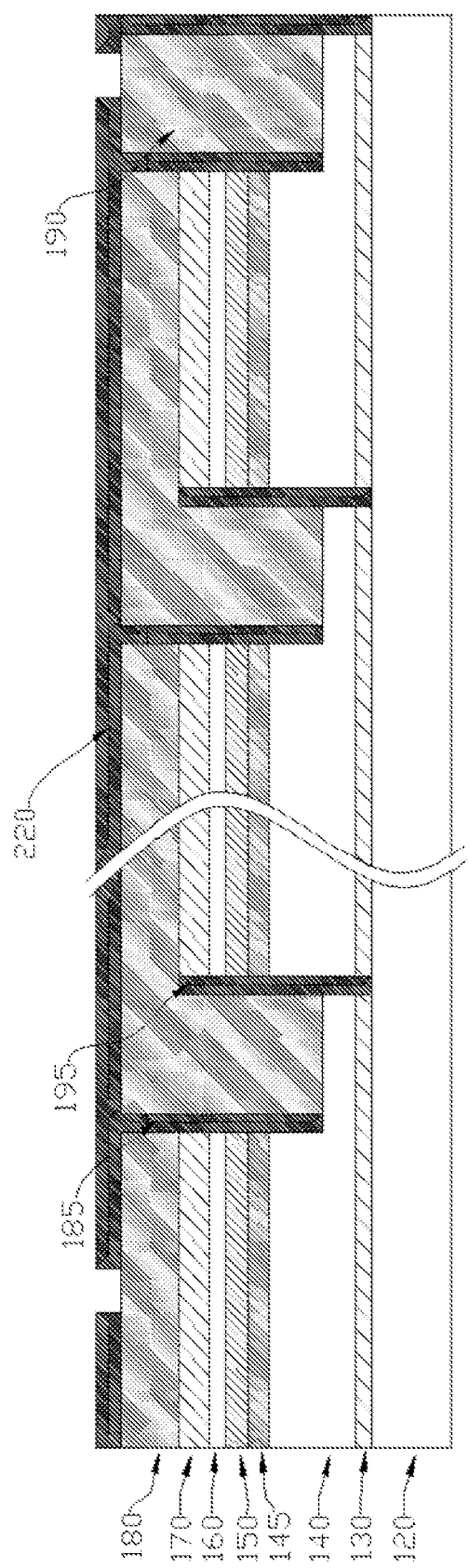

AC LED DEVICE AND ITS MANUFACTURING PROCESS FOR GENERAL LIGHTING APPLICATIONS

This is a continuation-in-part of U.S. application Ser. No. 61/601,698, filed on Feb. 22, 2012, now abandoned.

REFERENCES CITED

U.S. Patent Documents

| | | |
|---|---|---|
| 4,271,408 | June 1981 | Teshima et al |
| 4,298,869 | November 1981 | Okuno et al |
| 5,091,756 | February 1992 | Iga et al |
| 5,521,935 | May 1996 | Irikawa et al |
| 5,936,599 | August 1999 | Reymond |
| 6,547,294 B2 | April 2003 | Collins et al |
| 2003/0122501 A1 | July 2003 | Clauberg et al |
| 2004/0075399 A1 | April 2004 | Hall et al |
| 2005/0087884 A1 | April 2005 | Stokes et al |
| 6,957,899 B2 | October 2005 | Jiang et al |
| 7,221,044 B2 | May 2007 | Fan et al |
| 2008/0017871 A1 | January 2008 | Lee et al |
| 7,474,681 B2 | January 2009 | Lin et al |
| 7,531,843 B2 | May 2009 | Lin et al |
| 2010/0059735 A1 | March 2010 | Lee et al |
| 7,714,348 B2 | May 2010 | Fan et al |
| 7,964,880 B2 | June 2011 | Lee et al |
| 7,834,364 B2 | November 2010 | Lee et al |
| 7,842,959 B2 | November 2010 | Lee et al |

BACKGROUND OF THE INVENTION

1. Field of Invention

The present invention relates to the design of an alternating current (AC) light-emitting diode (LED) device and its manufacturing process based on GaN epitaxial growth on transparent sapphire substrate. This design incorporates a special layout of LED cells monolithically integrated to form an LED device which can be directly connected to AC power sources 120V, 220V or other voltages without AC to DC drivers.

2. Description of the Related Art

LEDs are semiconductor diode devices to produce light when the diodes are forward biased and the recombination of electron and hole pairs release energy in the form of photons. Traditional light sources, such as incandescent lamps, which rely on visible portion of the thermal radiation from the filament heated to very high temperatures, and compact fluorescent lamps, which use discharge from mercury vapor and argon gas to generate UV light to excite luminophore for visible light. LED, a solid lighting device, has numerous advantages over traditional lighting options, including compact size, long lifetime, high durability, low power consumption, and absence of harmful mercury. LEDs are widely used as indicator lights, vehicle signal and illuminating lights, LCD backlights for TV and mobile devices, projector light sources, outdoor display and general illumination or lighting.

LEDs are low voltage DC devices that let electron pass in one direction and block electron flow when connected in the opposite polarity. They are driven by either DC voltage sources or by AC voltages with AC to DC drivers to supply the desired DC voltage.

To allow LEDs to directly connect to the AC power sources without using AC to DC drivers, two sets of LEDs are connected in parallel with opposite polarity, as described by Okuno et al in U.S. Pat. No. 4,298,869 entitled "LIGHT-EMITTING DIODE DISPLAY" and Reymond in U.S. Pat. No. 5,936,599 entitled "AC POWERED LIGHT EMITTING DIODE ARRAY CIRCUITS FOR USE IN TRAFFIC SIGNAL DISPLAYS". Their approaches were based on expensive discrete single LED emitters and also required complex wiring and assembly process. Fan et al in U.S. Pat. No. 6,957,899 B2 entitled "LIGHT EMITTING DIODES FOR HIGH AC VOLTAGE OPERATION AND GENERAL LIGHTING" proposed the design of a single high voltage LED chip, composed of two arrays of series-connected individual LEDs in opposite polarity for connection to high voltage AC sources. The design doubles the number of LED diodes in the chip to achieve the same amount of light output from similar DC driven LED device. Hall et al in U.S. Pat. No. 2004/0075399 A1 entitled "LED LIGHT ENGINE FOR AC OPERATION AND METHODS OF FABRICATING SAME" proposed a chip layout design to deal with issues related to individual open or short diode in the series-connected chains. Lee et al in the U.S. Pat. No. 7,834,364 B2 entitled "AC LIGHT EMITTING DIODE AND METHODE FOR FABRICATING THE SAME" adopted a similar approach as described by Fan et al, and described how the individual LEDs were connected to form a single AC LED chip. Lin et al in the U.S. Pat. No. 7,474,681 B2 entitled "ALTERNATING CURRENT LIGHT-EMITTING DEVICE" proposed a different design to incorporate multiple active layers with a rectifier bridge in the design so the active layers take turns to emit light with different colors when powered by AC voltage sources. There are no specifics regarding how to incorporate the rectifier bridge and how to handle specific AC line voltages. Lee et al in another U.S. Pat. No. 7,964,880 B2 entitled "LIGHT EMITTING ELEMENT WITH A PLURALITY OF CELLS BONDED, METHOD OF MANUFACTURING THE SAME, AND LIGHT EMITTING DEVICE USING THE SAME" described a lateral and a vertical chip with LED cells monolithically connected to take high DC voltage and also connected to an external predetermined rectifier bridge to handle AC voltage. However, there were no specifics regarding how to integrate the rectifier bridge into the LED chip design, and how to handle different AC line voltages.

Therefore, a need exists to develop a novel alternating current light-emitting diode chip, based on flip-chip technology, to address the drawbacks of the previous art, and to provide a lower cost and a more reliable solution for the general lighting industry.

SUMMARY OF THE INVENTION

The present invention is to overcome the drawbacks of the previous arts related to the AC LED chip design and its manufacturing process. The new light-emitting device has a built-in rectifier bridge constructed using the same diodes as other arrayed light emitting cells, and a protection mechanism using resistors and capacitors embedded in the chip carrier. This design, combined with a new wafer fabrication process, enables the AC power source directly connect to the device. The monolithically integrated approach at wafer level is used to manufacture a single AC LED device with a plurality of light emitting cells connected in series. The chip design and the fabrication process minimize process steps, improve product yield, and reduce overall product cost.

For the present invention, five blocks of light emitting elements connected in series, with number of cells in each block depending on the AC line voltage and individual cell diode operating and reverse breakdown voltage, on a single substrate with specially arranged layout to form an AC light emitting device.

The AC light emitting device comprises the plurality of light emitting cells, each of which includes a transparent substrate, a buffer layer of undoped or silicon doped gallium nitride (GaN) stacked on the substrate, a heavily silicon doped n-type GaN layer, an active layer consisting of multiple quantum well (MQW) formed through alternating GaN and InGaN in a pre-determined region on top of the n-GaN layer, an electron block layer consisting of magnesium doped AlGaN, and a magnesium doped p-type GaN layer formed on top of the electron blocking AlGaN layer. A stress release super lattice (SL) structure consisting of alternating very thin GaN and InGaN layers is inserted between n-GaN and multiple quantum well to release layer stress and to improve internal quantum efficiency of the light emitting cells.

Each cell is isolated from adjacent cells through lithography patterning and dry or wet etch process. Then, another patterning and dry or wet etch process is used to partially expose the n-GaN layer, which is then connected to the p-GaN layer of adjacent cells. The isolation oxide or nitride is deposited and etched according to AC light emitting device layout design. The wafer is then covered with blank metal films and the metal connection lines are formed through patterning and dry etch. A subsequent passivation process is used to cover the metal lines with silicon oxide or nitride layer. A final etch of the passivation layer exposes the underneath metal to form p and n-type electrodes for connection to the external power sources. The transparent sapphire substrates then go through steps of grinding and polishing to reduce its thickness. The wafers with AC light emitting chips are cut into individual dies, whose exposed metal electrodes are connected to the metal bumpers on the chip submount carrier, and then are covered with phosphors of specific color to achieve the desired LED color and light output power when connected to the AC voltage sources.

The light emitting cells inside the structure of the AC LED device are to be manufactured in flip-chip forms, so the generated light comes out from the transparent substrate side. The connection electrodes of the light-emitting device contact the metal bumps on the top surface of the submount substrate. Heat generated from the light-emitting device is dissipated through the submount substrate, thereby promoting the dissipation of heat, reducing the thermal load on the light emitting device, improving light emitting efficiency, and lengthening the lifetime of the light emitting devices.

All light emitting cells in the structure of the AC LED device have the same light emitting area. They may have the same or similar wavelength, the same or similar operating and reverse breakdown voltage as those of the other LED cells in the AC LED device.

Thus, the structure of the LED device may be used to generate uniform light output, and to provide stable and durable lighting solutions for a wide range of applications.

The objectives, constructions, features, and functions of the invention may be better understood through the following detailed description with respect to the preferred embodiments in connection with the accompanying drawings.

BRIEF DESCRIPTION OF THE DRAWINGS

FIG. 3 is a cross sectional view of a light emitting cell according to the embodiment of the present flip-chip design.

FIG. 4A is a top view of one type of light emitting cell according to the embodiment of the present invention. FIG. 4C is a variation of the cell illustrated in FIG. 4A. FIG. 4D is a variation of the cell illustrated in FIG. 4B with different n-contact shape.

Figure 13A:
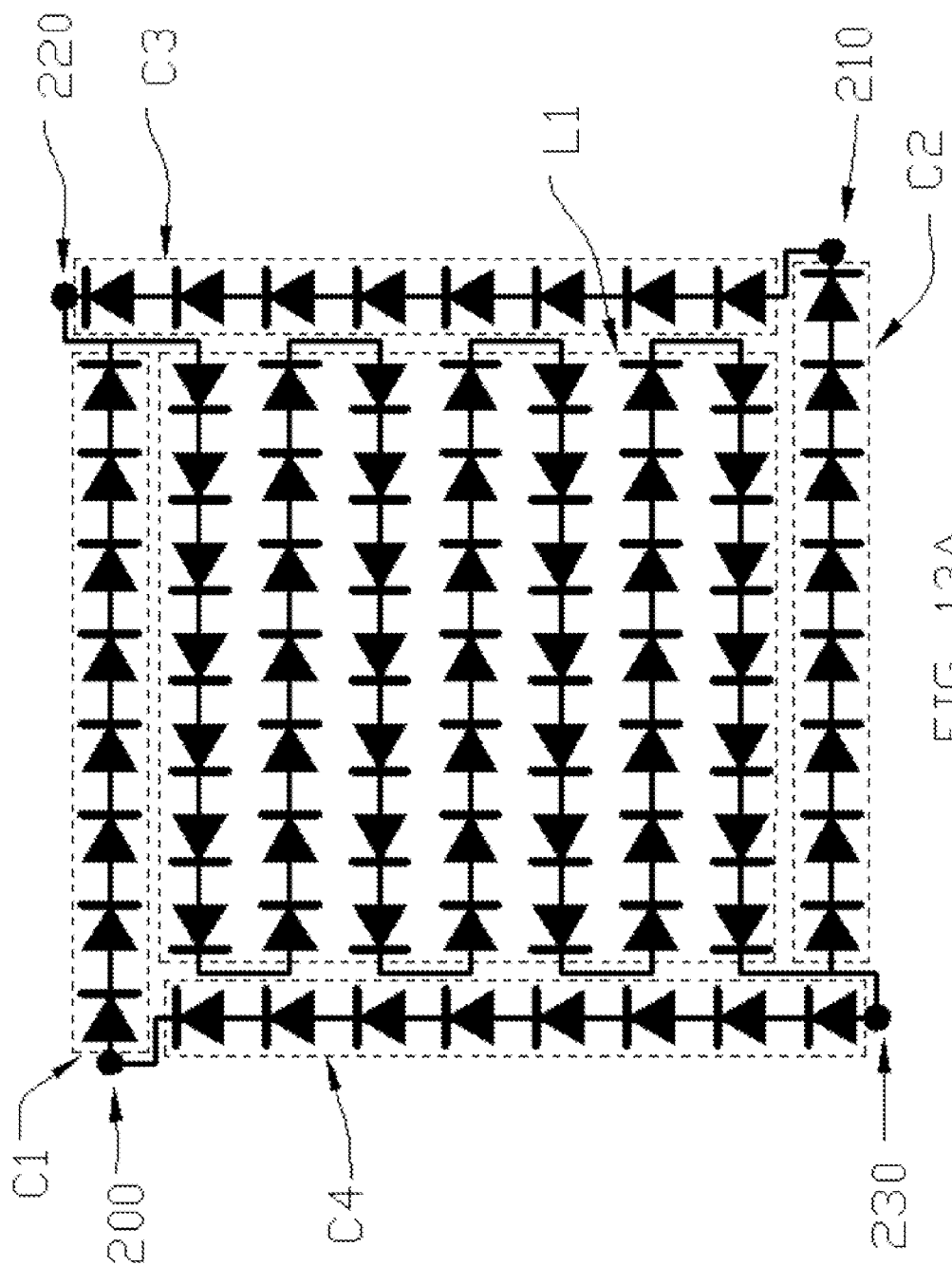
FIG. 13A is the sixth variation of diode interconnection schematic diagram with 65 emitting cells in series mode according to the embodiment of the present invention. FIG.

13B is an illustration of a plurality of structures of AC LED cells connected in a matrix form according to the equivalent circuit diagram of FIG. 13A. The AC device's operating voltage is between 210 and 220V AC.

Figure 14A:
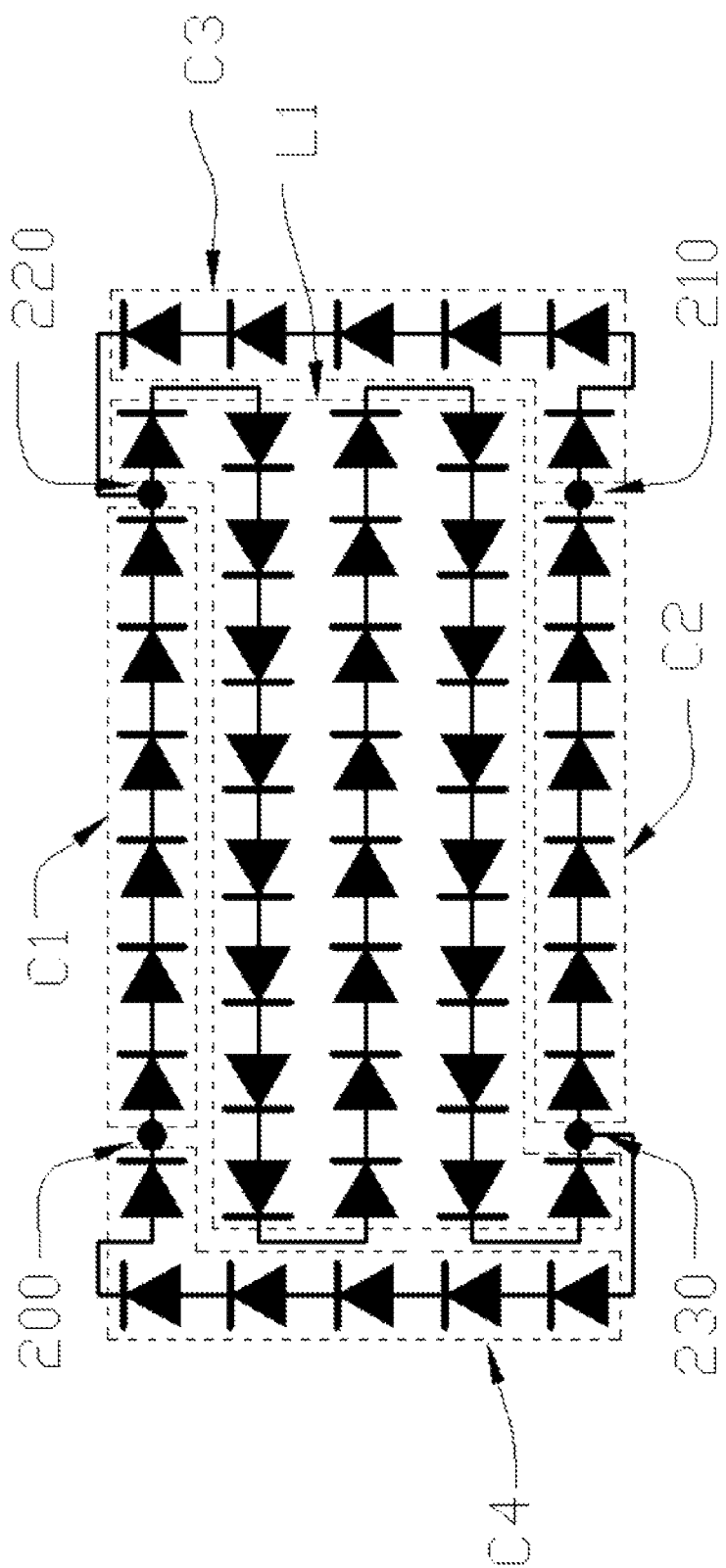
Figure 14B:
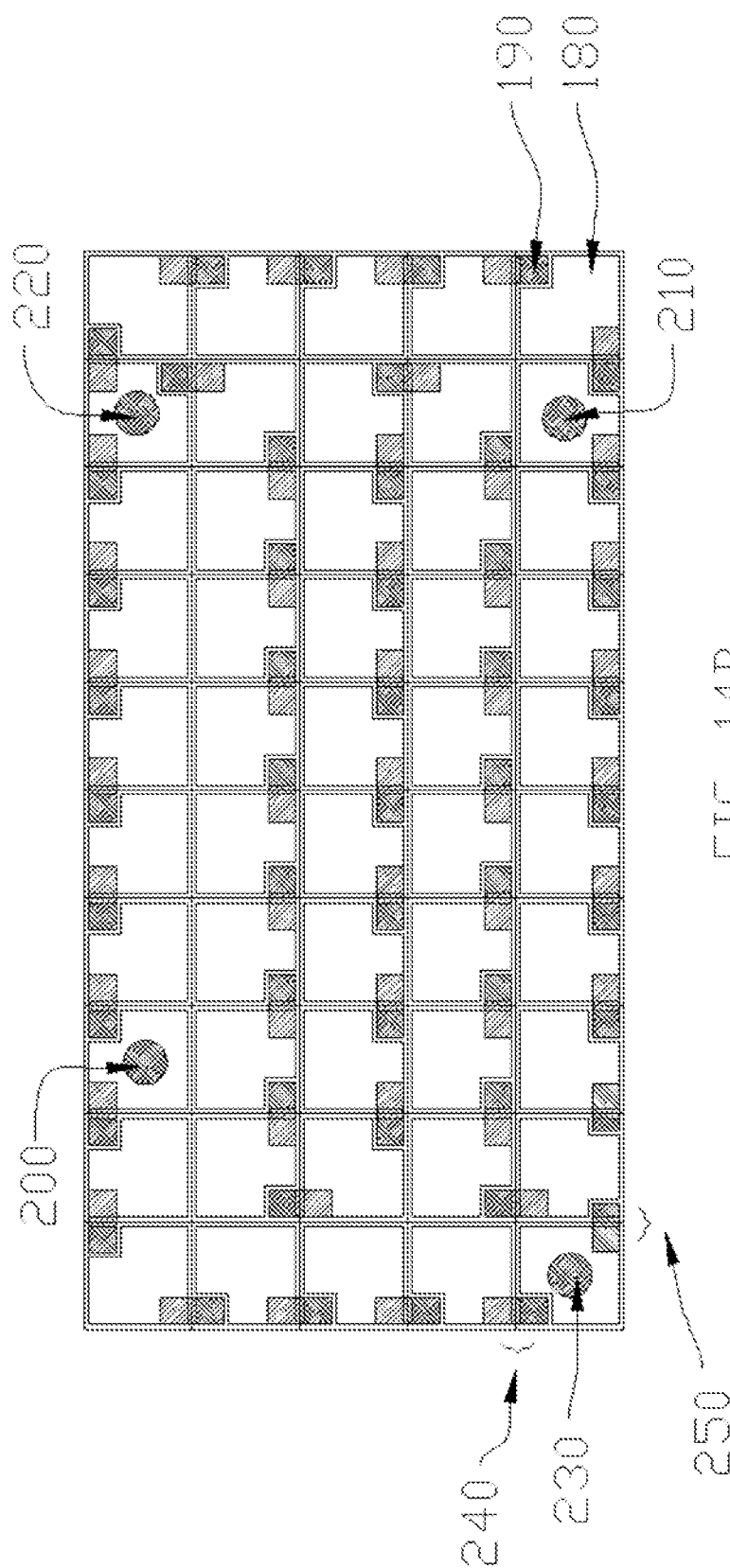

FIG. 14A is the seventh variation of the diode interconnection schematic diagram with 6 light emitting cells in each of the rectifier branch, and a total of 38 light emitting cells in series mode according to the embodiment of the present invention. FIG. 14B is an illustration of a plurality of structures of AC LED cells connected in a matrix form according to the equivalent circuit diagram of FIG. 14A. The AC device's operating voltage is between 110 and 120V AC, or two of them in series mode for 220 and 240V AC sources.

Figure 15A:
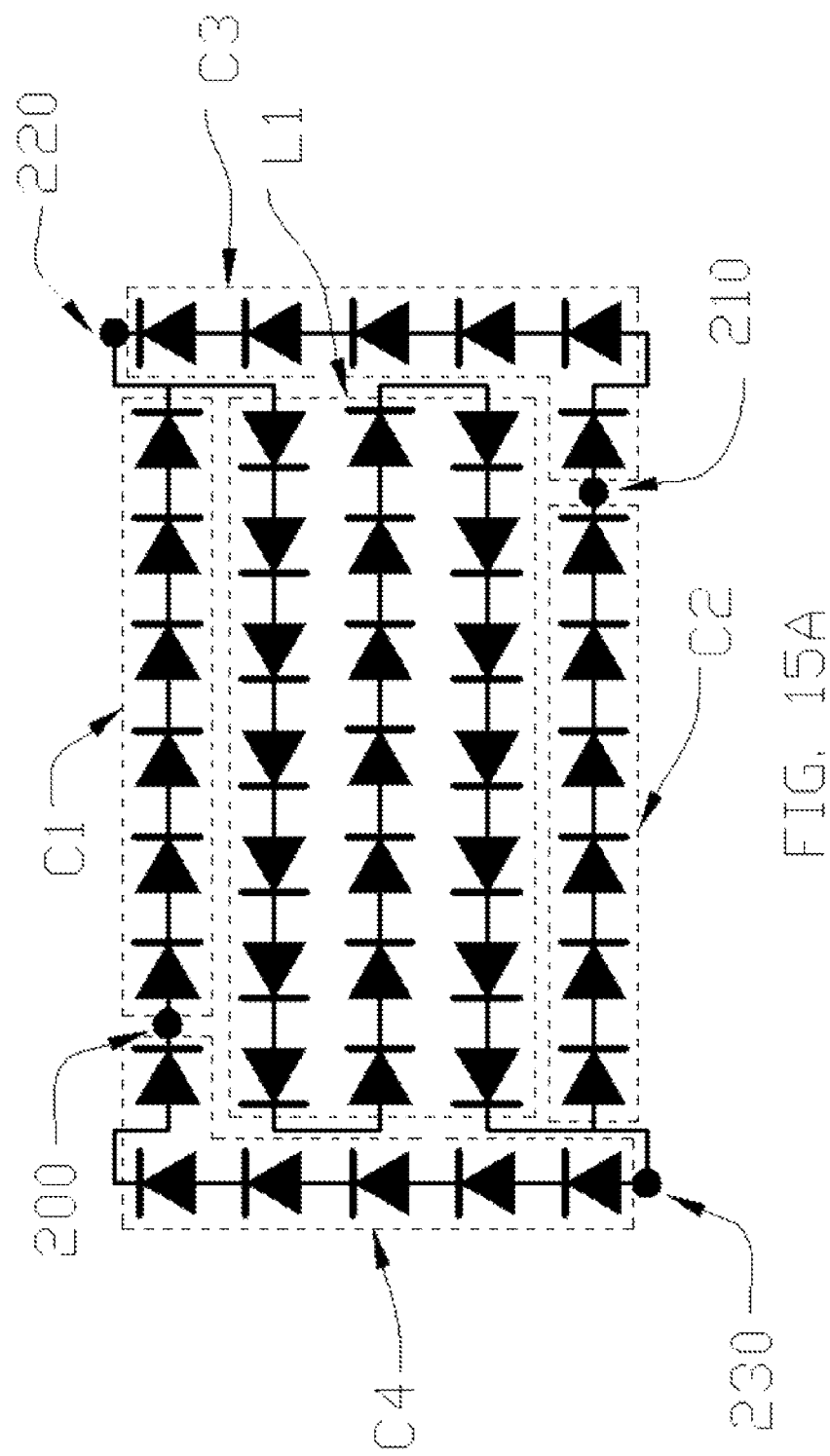
Figure 15B:
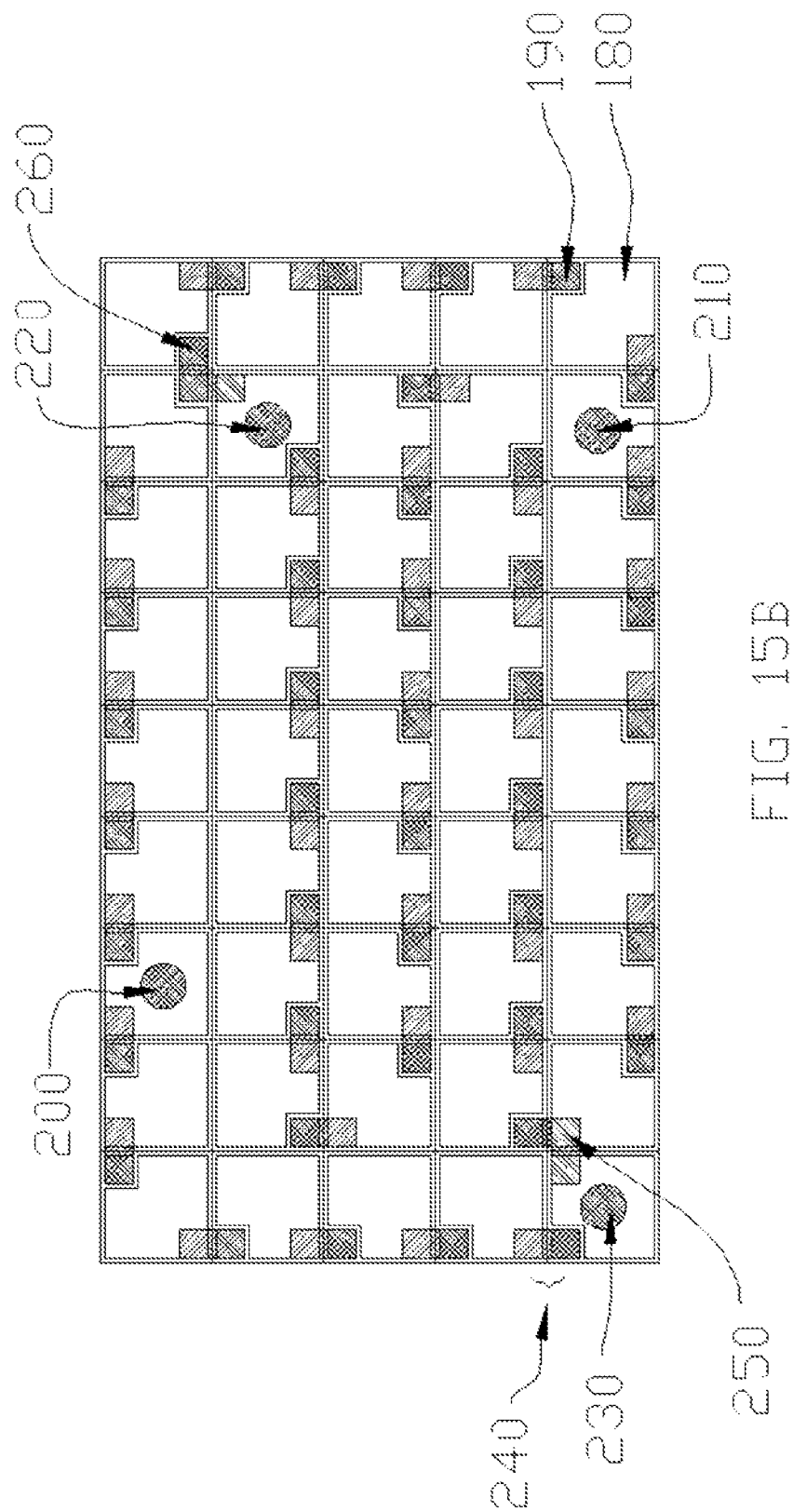

FIG. 15A is the eighth variation of the diode interconnection schematic diagram with 6 light emitting cells in each of the rectifier branches, and a total of 33 light emitting cells in series mode according to the embodiment of the present invention. FIG. 15B is an illustration of a plurality of structures of AC LED cells connected in a matrix form according to the equivalent circuit diagram of FIG. 15A. The AC device's operating voltage is between 110 and 120V AC, or two of them in series mode for 220 and 240V AC source.

FIG. 16A-16E are cross sectional view of the fabrication process flow of AC LED device according to the embodiment of the present invention.

DETAILED DESCRIPTION OF THE INVENTION

The embodiments of the present invention disclose the structure of the alternating current light emitting diodes and the associated manufacturing process flow in details with reference to the accompanying drawings. The present invention is not limited to the embodiments but may be implemented into other forms. The following embodiments are provided only for illustrative purposes so that those skilled in the art can fully understand the scope of the present invention. Throughout the drawings, the width, length, thickness and the like of elements may be exaggerated for convenience of illustration. Like components are designated by like reference numerals throughout the specification and drawings.

Figure 1A:
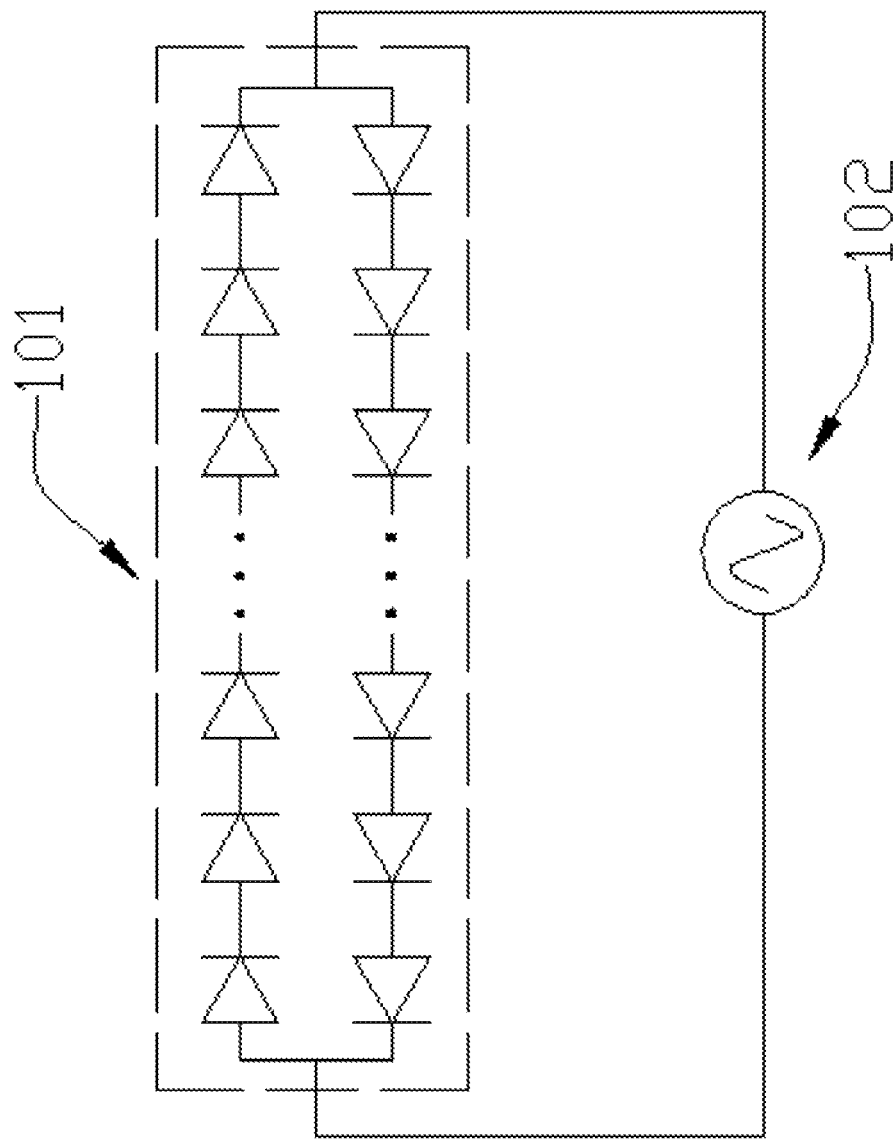
FIG. 1A is a diagram to illustrate a conventional AC LED device with two sets of series-connected light emitting cells in opposite polarity.
Figure 1B:
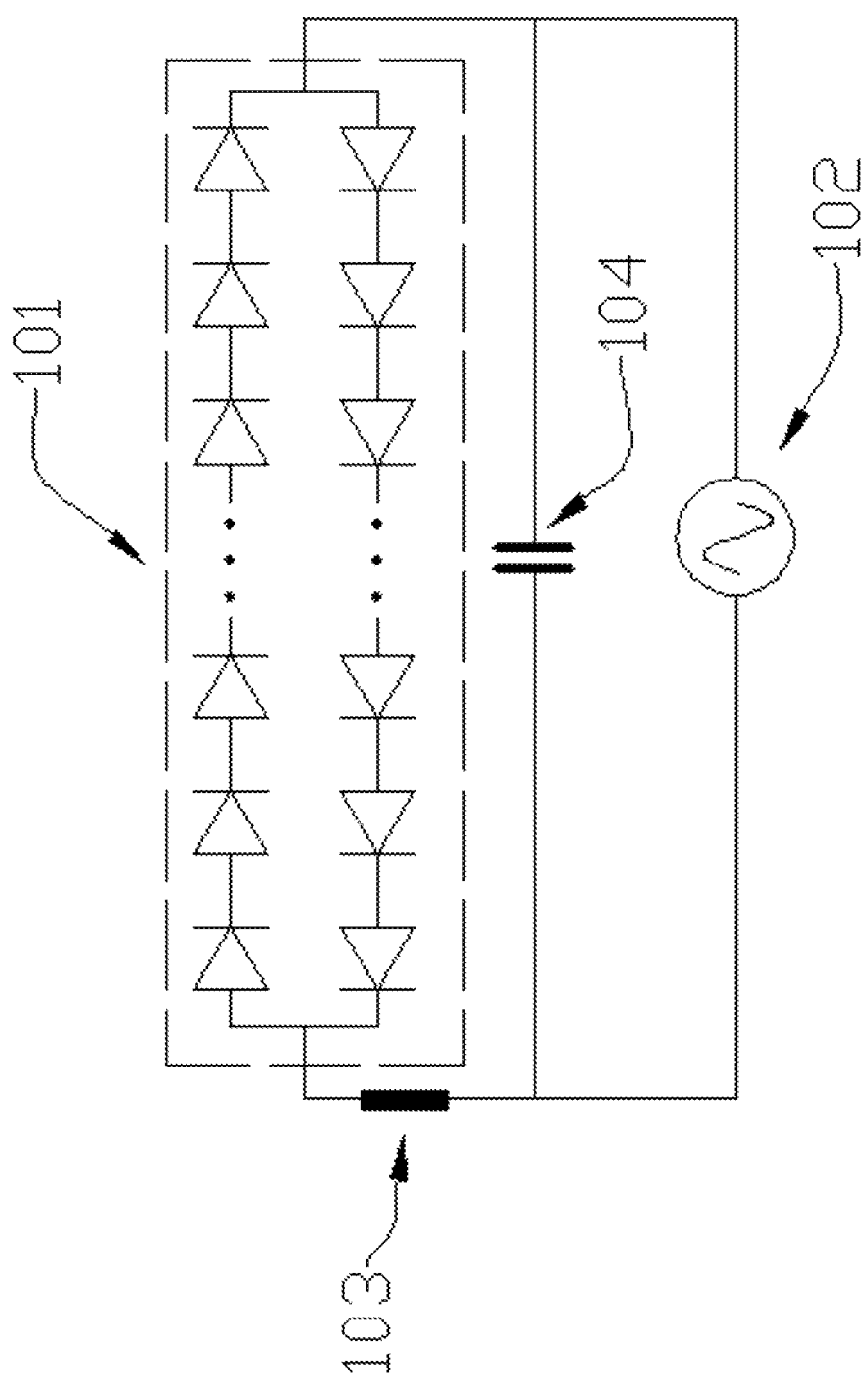
FIG. 1B is similar to FIG. 1A with addition of either an optional protective resistor or an optional capacitor or both a protective resistor and a capacitor to prevent voltage spike during device operation.

FIG. 1A illustrates a prior art of a single high voltage AC LED chip 101 connected to a high voltage AC power supply 102. As shown, the single high voltage AC LED chip 101 consists of two arrays of series connected individual smaller LED cells in opposite polarity. The two arrays of series connected individual LEDs are then connected to the positive and negative electrodes of the high voltage AC power source 102. FIG. 1B illustrates an improvement of the art with addition of an optional resistor in series mode with the single chip high voltage AC LED device 101 and another optional capacitor in parallel mode. The function of the resistor or the capacitor is to protect the high voltage AC LED device against high voltage or high current spikes during operation after they are connected to the high voltage AC power supply 102. However, the single high voltage AC LED 101 device has a few drawbacks. One is the inefficient use of smaller LED cells, since only half of the LED cells are energized at any given moment, with the other half being negative biased and not being energized to generate light. The other drawback is that the voltage sweep is only effective about 65% of the time to turn on LED cells during positive voltage cycle when the effective AC voltage is similar to or the same as each individual LED cell's operating voltage.

Figure 2:
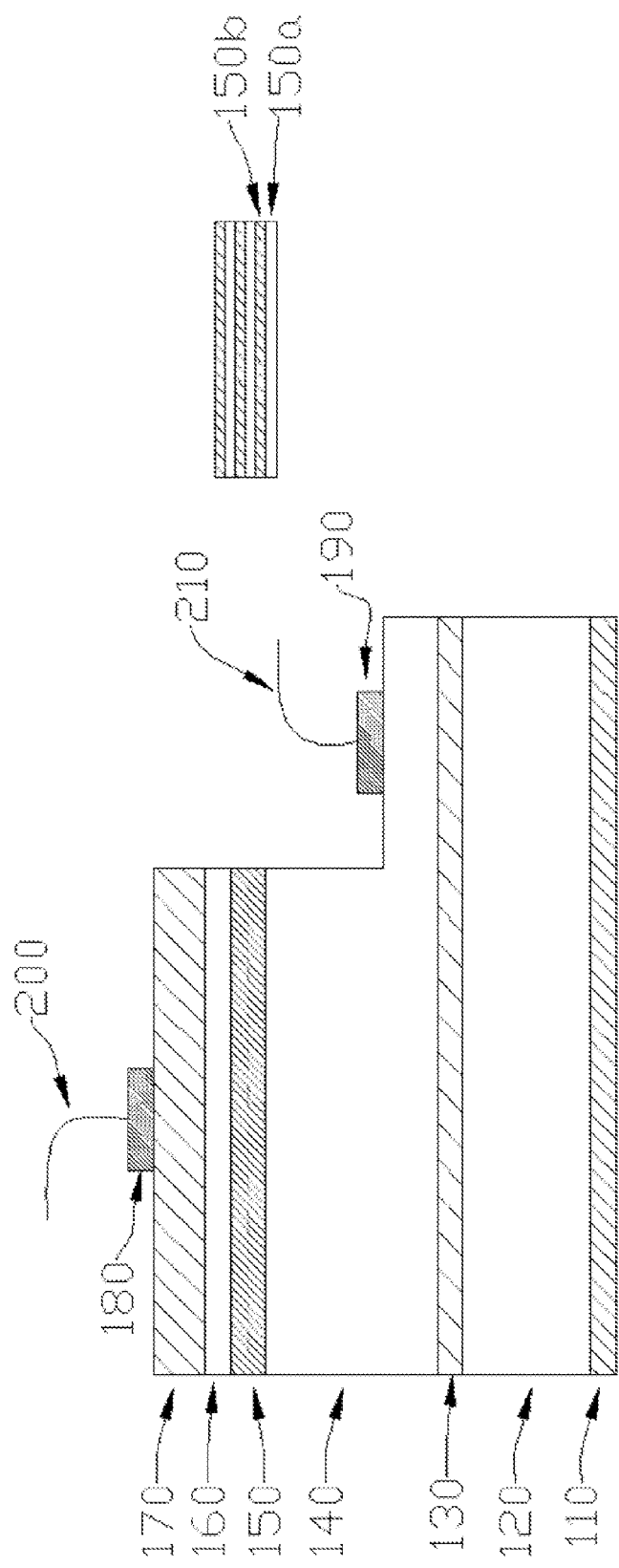
FIG. 2 is a cross sectional view of a conventional light-emitting cell based on lateral chip design, which requires two wires for each device.

FIG. 2 illustrates a cross sectional view of a prior art of a standard lateral LED chip structures. The light emitting cell comprises a substrate 120; a buffer layer 130; an n-type semiconductor layer 140; an active layer 150 consisting of alternating quantum barrier layer 150a and quantum well layer 150b multiple times; an electron block layer 160; and a p-type semiconductor layer 170; an n-type bonding pad 190 formed on the exposed region of the n-type semiconductor layer 140; and a p-type bonding pad 180 formed on the p-type semiconductor layer 170; a metal layer and a Distributed Bragg Reflector (DBR) layer 110 on the other side of the substrate 120 to improve light extraction of the light emitting cells.

In order to reduce operating voltage and further improve device performance, an ohm-contact metal alloy layer (not shown in FIG. 2) is provided below both the n-type bonding pad and the p-type bonding pad. The metal alloy layer for n-contact has lower work function, while the layer for p-contact has higher work function than the underneath GaN layer. Moreover, a transparent and conductive layer may be added between the p-type semiconductor layer 170 and the p-type boding pad 180 (not shown in FIG. 2) to reduce p-type semiconductor contact resistance and to reduce LED cell's operating voltage.

The LED cell is energized and the light is generated when bonding wire 200 connects p-type semiconductor 170 through p-type bonding pad 180 to the positive electrode of the power source, while bonding wire 210 connects n-type semiconductor 140 through n-type bonding pad 190 to the negative electrode of the power source. The lateral chip manufacturing process flow requires fewer process steps, but the p-type bonding pad consumes effective light emitting area, generates non-uniform light output, and reduces light output efficiency.

FIG. 3 illustrates a cross sectional view of a flip-chip light emitting cell structure according to the embodiment of the present invention.

Referring to FIG. 3, the light emitting cell comprises a transparent substrate 120 such as sapphire, a low temperature undoped GaN buffer layer 130, a silicon doped n-type GaN layer 140, a stress release super lattice layer 145 which consists of alternating thin layers of undoped InGaN 145a and undoped GaN 145b multiple times, an active layer 150 which consists of alternating undoped InGaN quantum well layer 150a and undoped GaN quantum barrier layer 150b multiple times, an electron block layer 160 which consists of magnesium doped p-type AlGaN, a magnesium doped p-type GaN layer 170, a p-type metal contact layer 180 formed on the p-type GaN layer 170, and an n-type metal contact layer 190 formed on the exposed region of the n-type GaN layer 140. The p-type metal contact layer and the n-type metal contact layer are isolated by layer 185, which is made from silicon oxide or silicon nitride or a combination of silicon oxide and nitride. The isolation between adjacent light emitting cells is achieved through complete removal of materials between them through dry or wet etching and then filling with silicon oxide or silicon nitride or a combination of both silicon oxide and silicon nitride layer 195. The light emitting device surface is then covered with passivation silicon oxide or silicon nitride layer 220.

The p-type and n-type metal contact layers are made from tungsten, aluminum or copper. A diffusion barrier made from titanium or tantalum nitride, nickel titanium or titanium tungsten alloy (not shown in FIG. 3) separates the p-type and n-type metal contact layers from the isolation oxide or nitride layers. The diffusion barrier also provides initial contact to the p-type GaN and n-type GaN layers. For operating voltage reduction and further performance improvement, a thin layer of chromium or nickel layer is deposited between diffusion barrier and the p-type and n-type metal contact layers (not shown in FIG. 3), respectively. Moreover, a transparent and conductive layer made from indium tin oxide may be provided between the p-type GaN layer 170 and the p-type metal contact layer 180 (not shown in FIG. 2) to reduce p-type GaN contact resistance and LED cell's operating voltage. The positive electrode of the light emitting cell is connected through the opening 200 on the passivation layer and the negative electrode is connected through the opening 210. The LED cell is energized and light is generated when p-type GaN 170 through p-type metal contact layer 180 is connected to the positive electrode of the power source, while n-type GaN 140 through n-type metal contact layer 190 is connected to the negative electrode of the power source.

Figure 4B:
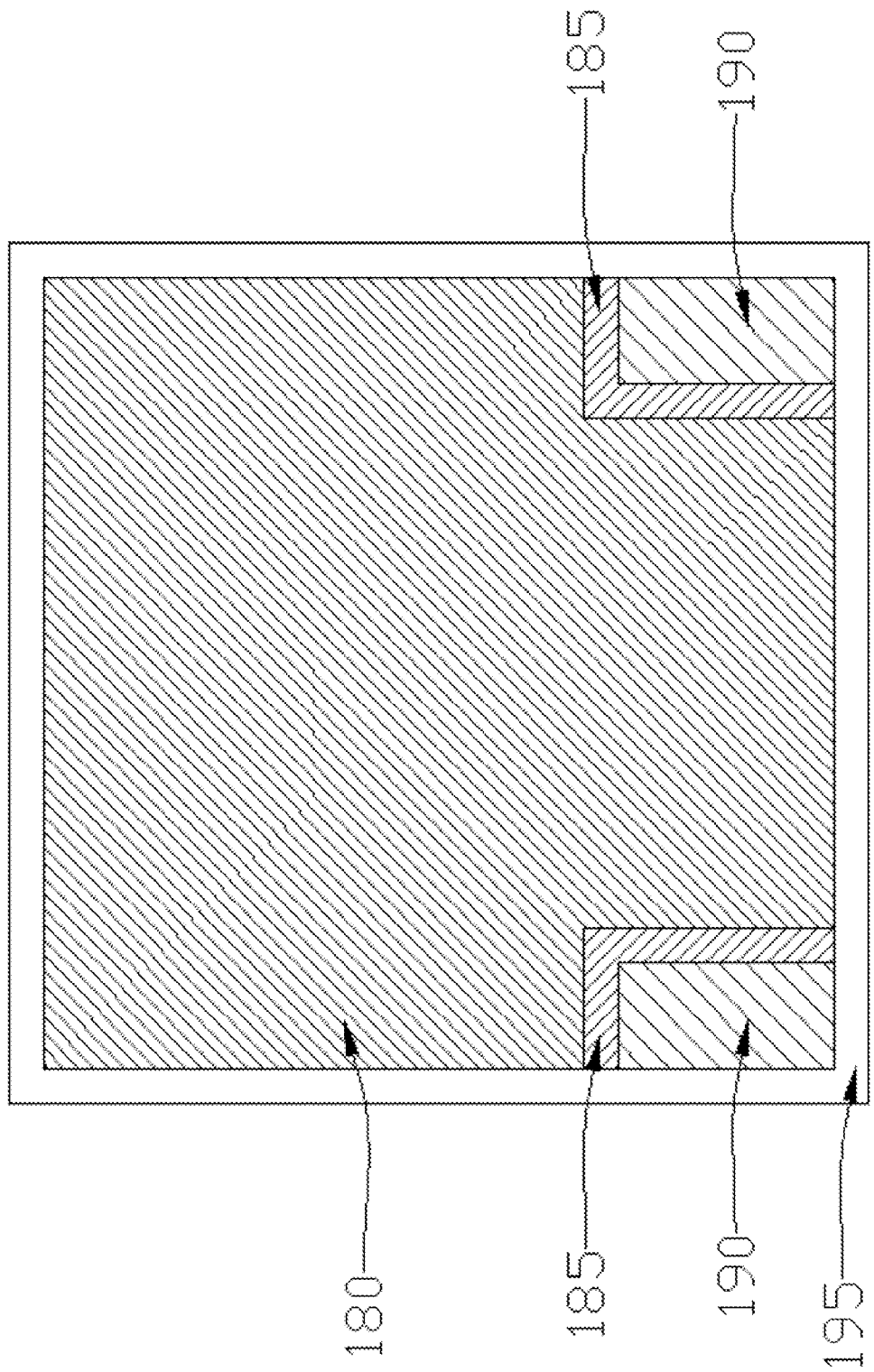
FIG. 4B is a top view of another type of light emitting cell according to the embodiment of the present invention.

FIG. 4A is a top view of one type of light emitting cells according to the embodiment of the present invention. FIG. 4B is a top view of another type of light emitting cells according to the embodiment of the present invention. The light emitting cells in FIG. 4A and FIG. 4B have the same area of p-type contact 180 and n-type contact 190. The layer 185 isolates n-type contact metal 190 from the stack of the p-type semiconductor GaN layer, the electron block AlGaN layer, the active multiple quantum well (MOW) layer, and the optional stress release super lattice layer which is not shown in FIG. 4A and FIG. 4B. The light emitting cell is separated from its adjacent cells through isolation layer 195. FIG. 4C and FIG. 4D, having the same area of p-type and n-type metal contact, illustrated another variation of the device cell design from the embodiment of the present invention. The n-contact metal layer in FIG. 4C has the shape of an "L", instead of the square as illustrated in FIG. 4A. Square-shaped light emitting cells are used here for illustration purposes only. Other cell shapes include triangles, rectangles, diamonds and other parallelograms. In the following drawings, only the unit cells from FIG. 4A and FIG. 4B are used for illustration purposes. However, the cell layout is not limited to the embodiments described here but may be implemented in other forms by those skilled in the art to meet light emitting cell's monolithic interconnection requirement.

Figure 5:
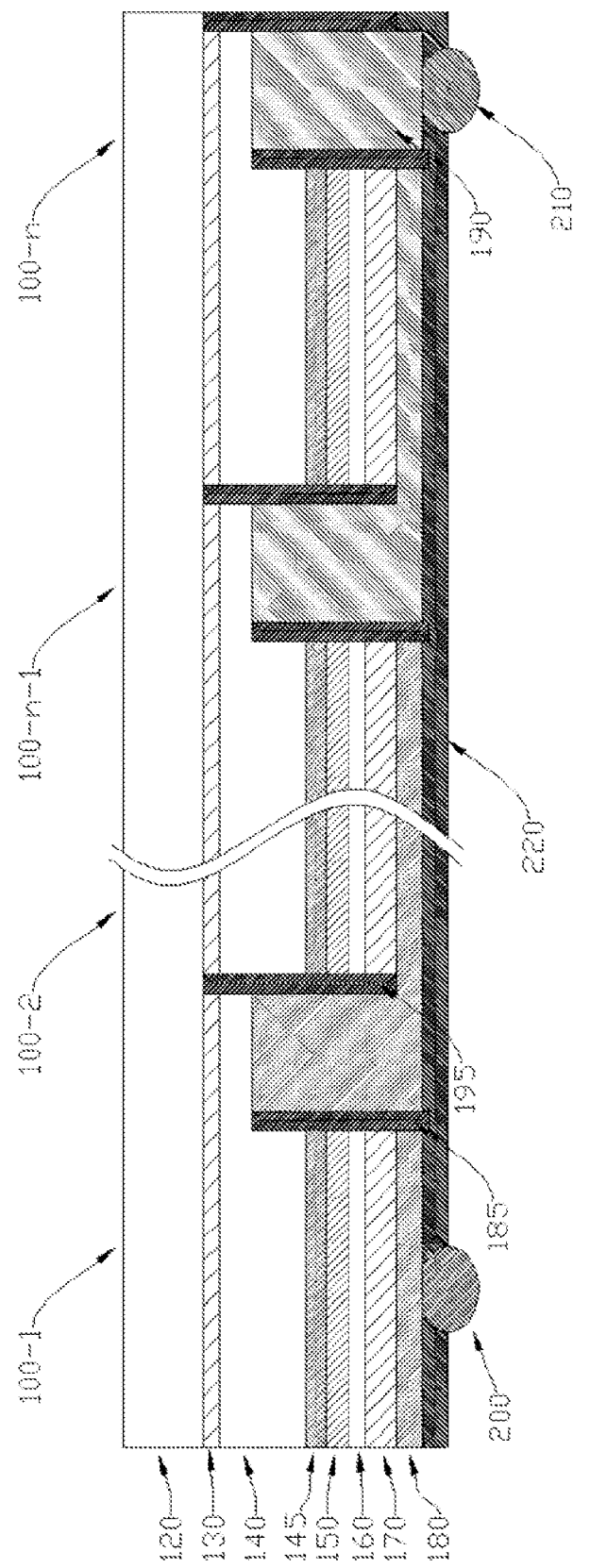
FIG. 5 is a cross sectional view illustrating an AC light-emitting device according to an embodiment of the present invention. Multiple light emitting cells are connected monolithically.

FIG. 5 is a cross sectional view illustrating an AC light-emitting device with light emitting cells monolithically connected in series mode according to the embodiment of the present invention.

Referring to FIG. 5, the AC light emitting device of the present invention has a plurality of light emitting cells 100-1 to 100-$n$ connected to one another in series mode. The p-type electric contact 180 of the light emitting cell 100-1 is connected to the positive electrode of the external AC power sources through metal bump 200, which itself is pre-formed and attached to the light emitting cell before the assembly process, and the specially designed positive electrode contact on the submount carrier of the AC light emitting device (not shown in FIG. 5). The n-type electric contact 190 of the light emitting cell 100-1 is connected to the p-type electric contact 180 of the adjacent light emitting cell 100-2, until the n-type electric contact 190 of the light emitting cell 100-$n$–1 is connected to the p-type electric contact 180 of the last light emitting cell 100-$n$ for a total of n cells connected in series mode. The n-type electric contact 190 of the light emitting cell 100-$n$ is then connected to the negative electrode of the external AC power sources through metal bump 210, which is pre-formed and attached to the light emitting cell, and the specially designed negative electrode contact on the submount carrier of the AC light emitting device (not shown in FIG. 5).

As shown in FIG. 5, each light emitting cell comprises a transparent substrate 120, a low temperature GaN buffer layer 130, a n-type GaN layer 140, an optional stress release super lattice layer 145, an active multiple quantum well (MQW) layer 150, an electron block layer 160, a p-type GaN layer 170. The p-type metal contact layer 180 is formed on the p-type GaN layer 170, and an n-type metal contact layer 190 is formed on the exposed region of the n-type GaN layer 140. The p-type metal contact layer and the n-type metal contact layer are separated by isolation layer 185. The separation of adjacent light emitting cells is through another isolation layer 195. The light emitting device surface is then covered with passivation layer 220. The positive and negative electric contacts are formed by etching through the passivation layer, through which electric contacts are produced using p-type metal contact bump 200 and n-type metal contact bump 210.

Figure 6A:
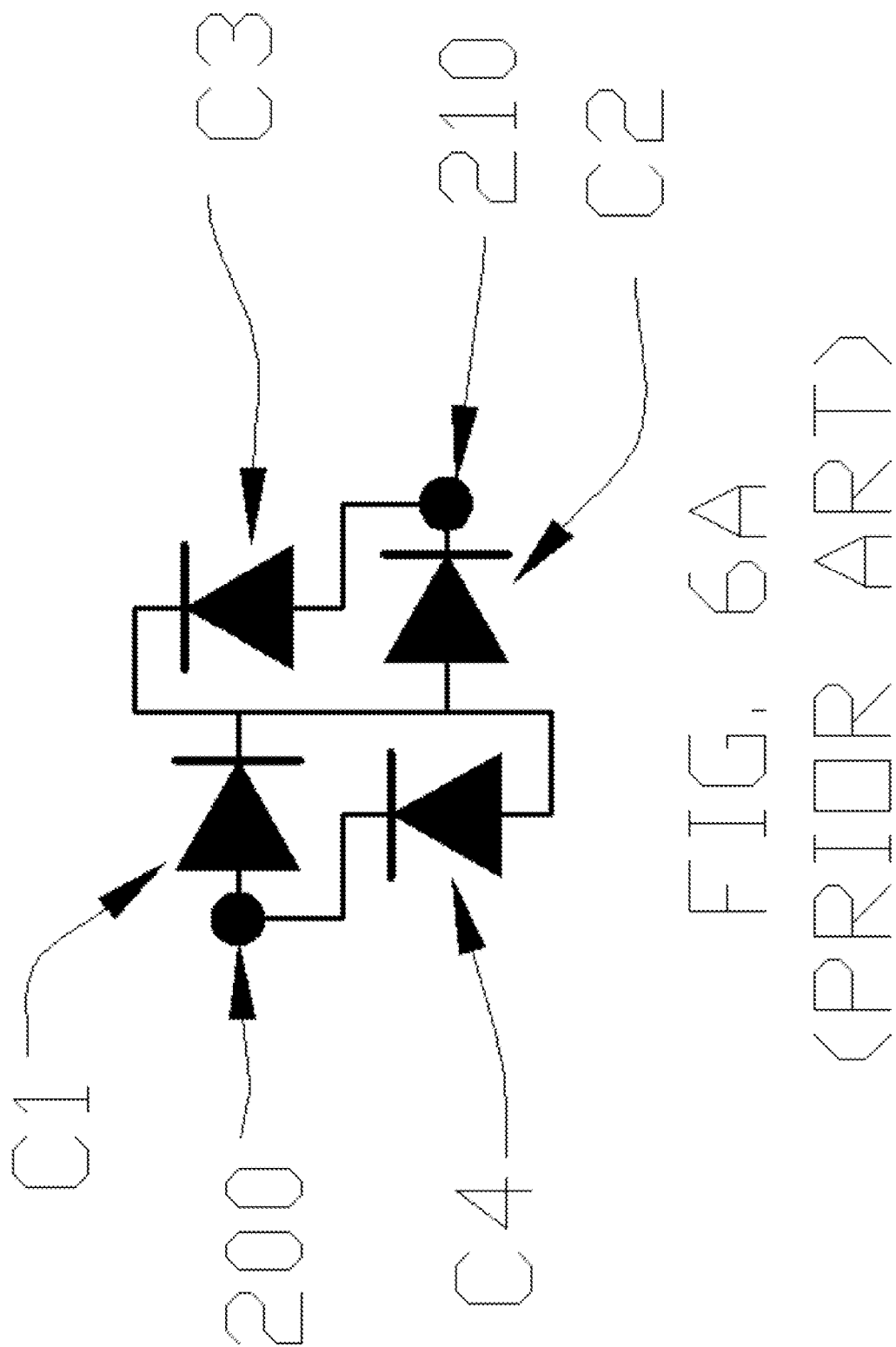
FIG. 6A is a prior art to illustrate a diode interconnection schematic diagram of the AC LED device with 2 emitting cells in series mode.
Figure 6B:
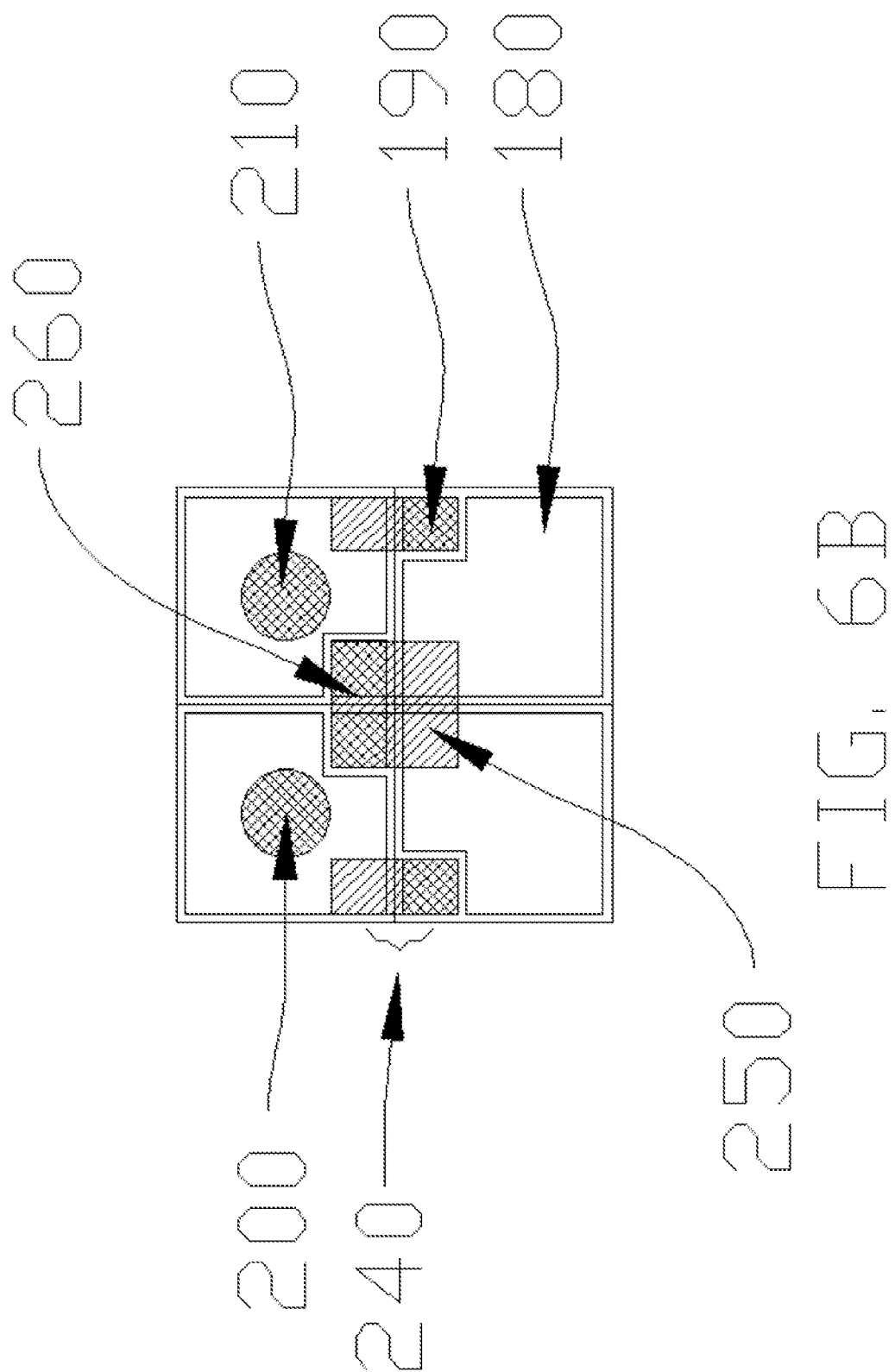
FIG. 6B is an illustration of a plurality of structures of AC LED cells connected in a matrix form according to the equivalent circuit diagram of FIG. 6A.

FIG. 6A illustrates a diode interconnection schematic diagram of four light emitting cells formed into the shape of a square or rectangle in the AC LED device. The AC light emitting device has four rectifier branches C1 to C4, each branch consisting of one light emitting cell. The equivalent circuit diagram is similar to the AC light emitting chip illustrated in FIG. 1. FIG. 6B is an illustration of a plurality of structures of AC LED cells connected in a matrix form according to the equivalent circuit diagram of FIG. 6A.

Referring to FIG. 6B, each light emitting cell has a positive metal contact 180 and a negative metal contact 190. The negative electrodes 190 of C1 and C3 are connected through a negative-to-negative bridge 260. The positive electrodes 180 of C2 and C4 are connected through a positive-to-positive bridge 250. The positive-to-negative bridge 240 is used to connect the positive metal contact of C1 to the negative contact of C4. Another bridge 240 (not labeled in FIG. 6B) is used to connect the positive metal contact of C3 to the negative contact of C2. In the flip chip design, the bridge 250 and 260 are connected monolithically during wafer fabrication process. Both 250 and 260 are also connected together for the four-cell AC light emitting device. The positive electrode of the external AC voltage source is connected to the positive metal contact 200 of C1 and the negative electrode of the external AC voltage source is connected to the negative metal contact 210 of C2 through a positive to negative bridge 240.

Due to the flip chip design, the negative metal contact of cell C2 is electrically connected to the positive metal contact of cell C3, making it possible for all four light emitting cells in the AC LED device to have the same structure and the same light emitting area. Each of the two light emitting cells C1 and C2 or C3 and C4 in the AC LED device are connected to each other in series mode. For a light emitting cell with an operating voltage between 2.9 and 3.5V, the operating AC voltage of the device is between 5.8 and 7V. During LED operation, only two of the light emitting cells are energized by the positive voltage sweep of the AC voltage source, while the other two are negatively biased and do not generate any light. The light emitting cell utilization rate is exactly 50%, make this prior art the most expensive AC light emitting chip design.

Figure 7A:
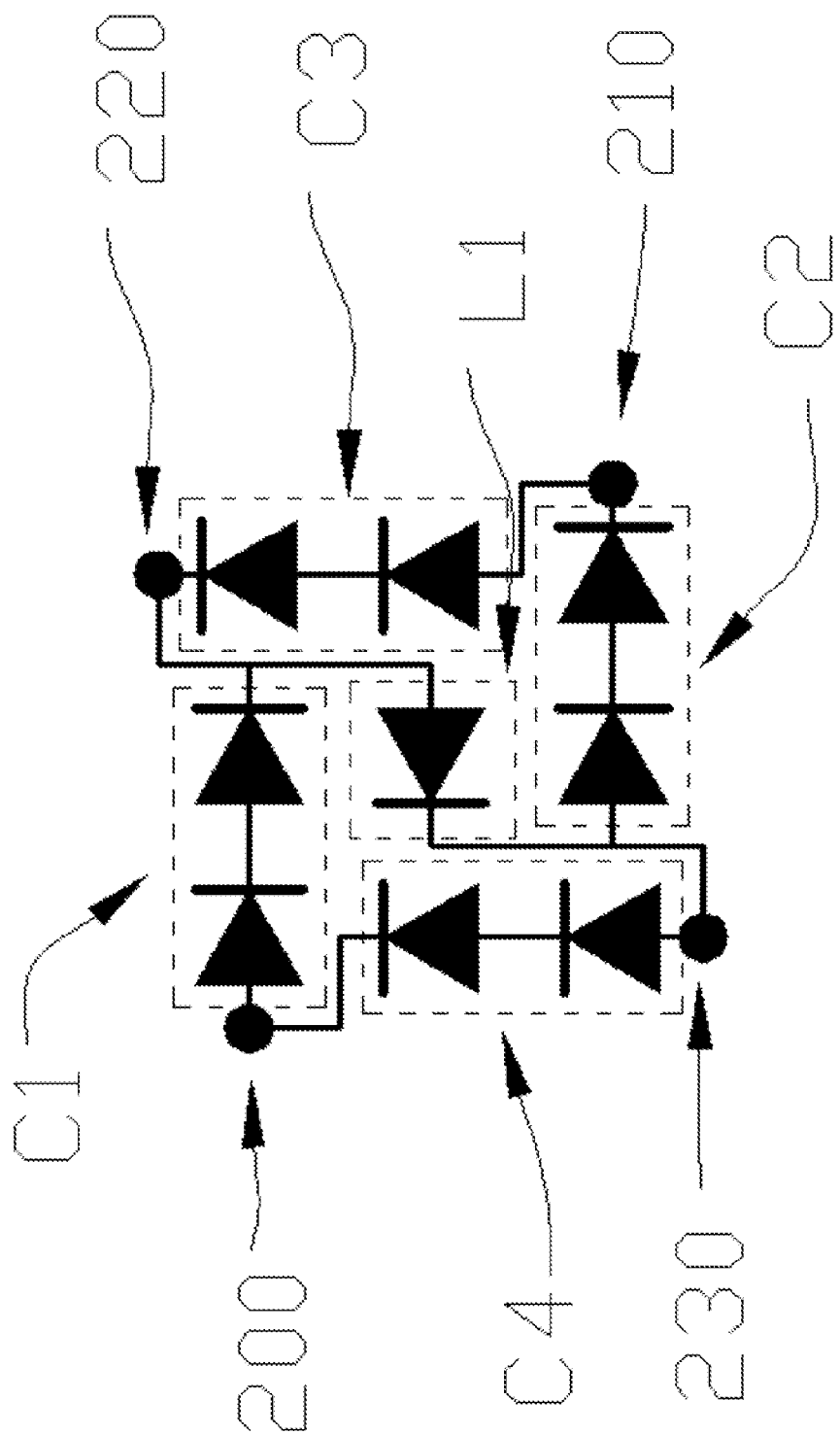
FIG. 7A is the diode interconnection schematic diagram of the AC LED device with 5 emitting cells in series mode according to the embodiment of the present invention.
Figure 7B:
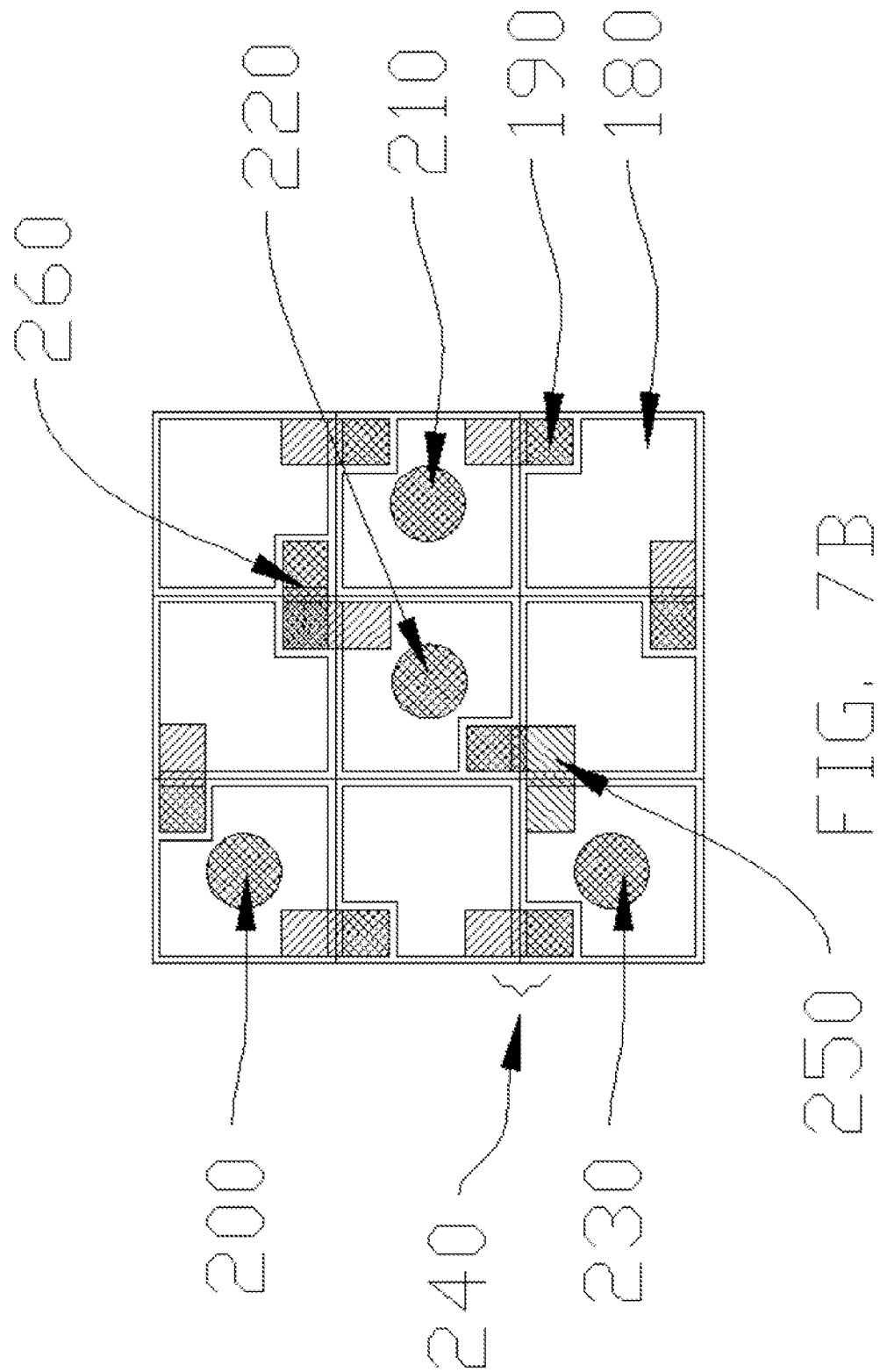
FIG. 7B is an illustration of a plurality of structures of AC LED cells connected in a matrix form according to the equivalent circuit diagram of FIG. 7A.

FIG. 7A illustrates the diode interconnection schematic diagram of nine light emitting cells formed into the shape of a square or rectangle in the AC LED device with five light emitting cells in series mode according to an embodiment of the present invention. FIG. 7B is an illustration of a plurality of structures of AC LED cells connected in a matrix form according to the equivalent circuit diagram of FIG. 7A.

Referring to FIG. 7A, the AC light emitting device has four rectifier branches C1 to C4, each consisting of two light emitting cells connected in series mode with one cell's positive contact being connected to the negative contact of the other cell, and a single light emitting cell L1.

Referring to FIG. 7B, each light emitting cell has a positive metal contact 180 and a negative metal contact 190. The positive-to-negative bridge 240 is used to connect the positive metal contact of one cell to the negative contact of an adjacent cell in each rectifier branch. The negative contact of the last cell in branch C1 is connected to the negative contact of the last cell in branch C3 through the negative-to-negative bridge 260, which is then connected to the positive contact of the light emitting cell L1. The positive contact of the first cell in branch C2 is connected to the positive contact of the first cell in branch C4 through a positive-to-positive bridge 250, which is then connected to the negative contact of the light emitting cell L1. The positive electrode of the external AC voltage source is connected to the positive contact 200 of the first light emitting cell in the rectifier branch C1, and the negative electrode of the external AC voltage source is connected to the negative contact 210 of the last cell in the rectifier branch C2, which is electrically connected to the positive contact of the first cell in the rectifier branch C3 through a positive-to-negative bridge 240. All nine light emitting cells in the AC LED device have the same structure and the same light emitting area. The contacts 220 and 230 provide electric connection for an optional capacitor to reduce voltage ripples across light emitting cell L1.

Since five light emitting cells are connected in series mode in the AC LED device, for a light emitting cell with an operating voltage between 2.9 and 3.5V, the operating AC voltage of the device is between 14.5 and 17.5V. During LED operation, five of the light emitting cells are energized by the positive voltage sweep of the AC voltage source, while the other four are negatively biased and do not generate any light. The light emitting cell utilization rate of present invention is therefore 55.6%, make this layout design better then the prior art, as illustrated in FIG. 6A and FIG. 6B.

Figure 8A:
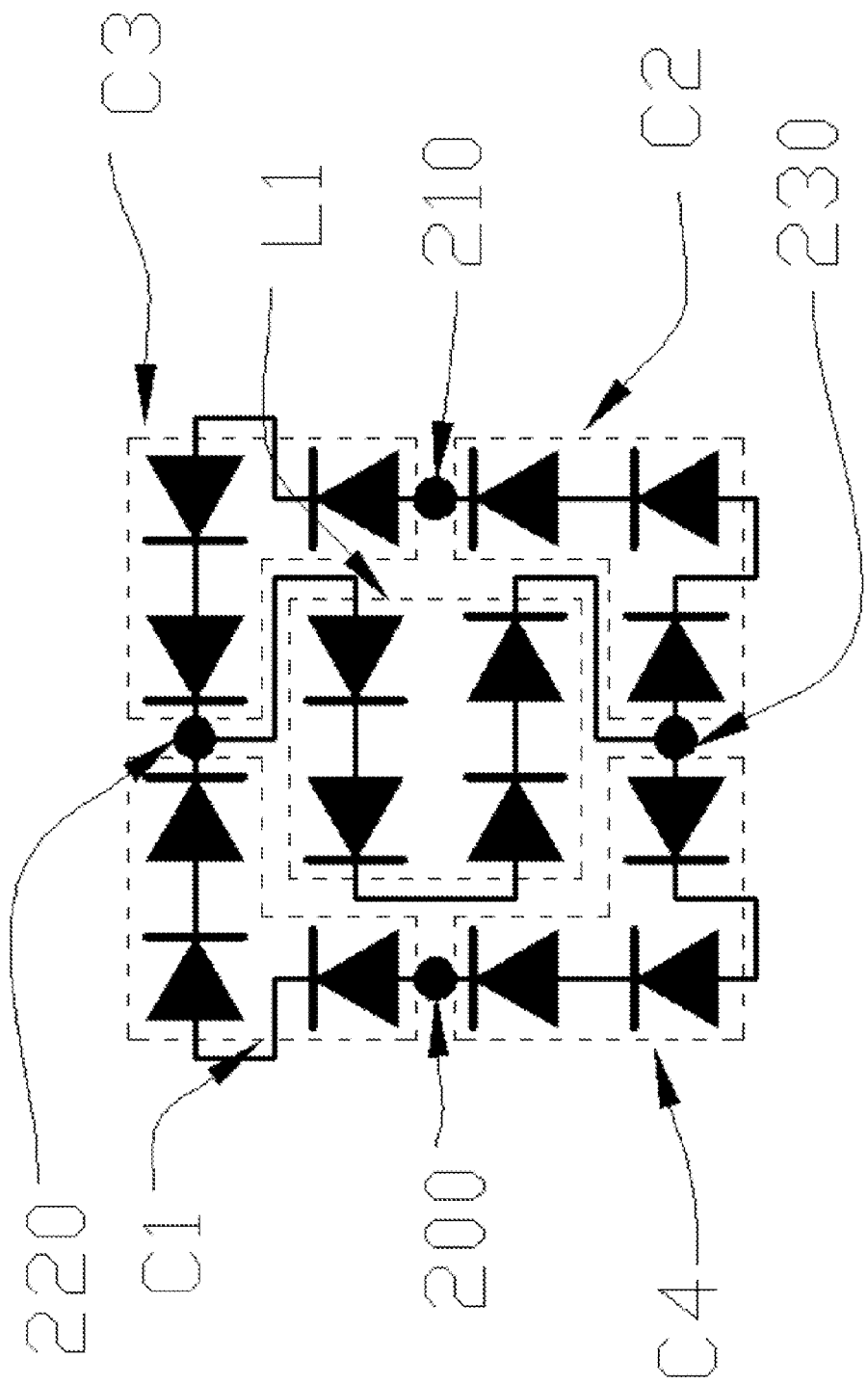
FIG. 8A is the first variation of diode interconnection schematic diagram of the AC LED device with 10 emitting cells in series mode according to the embodiment of the present invention.
Figure 8B:
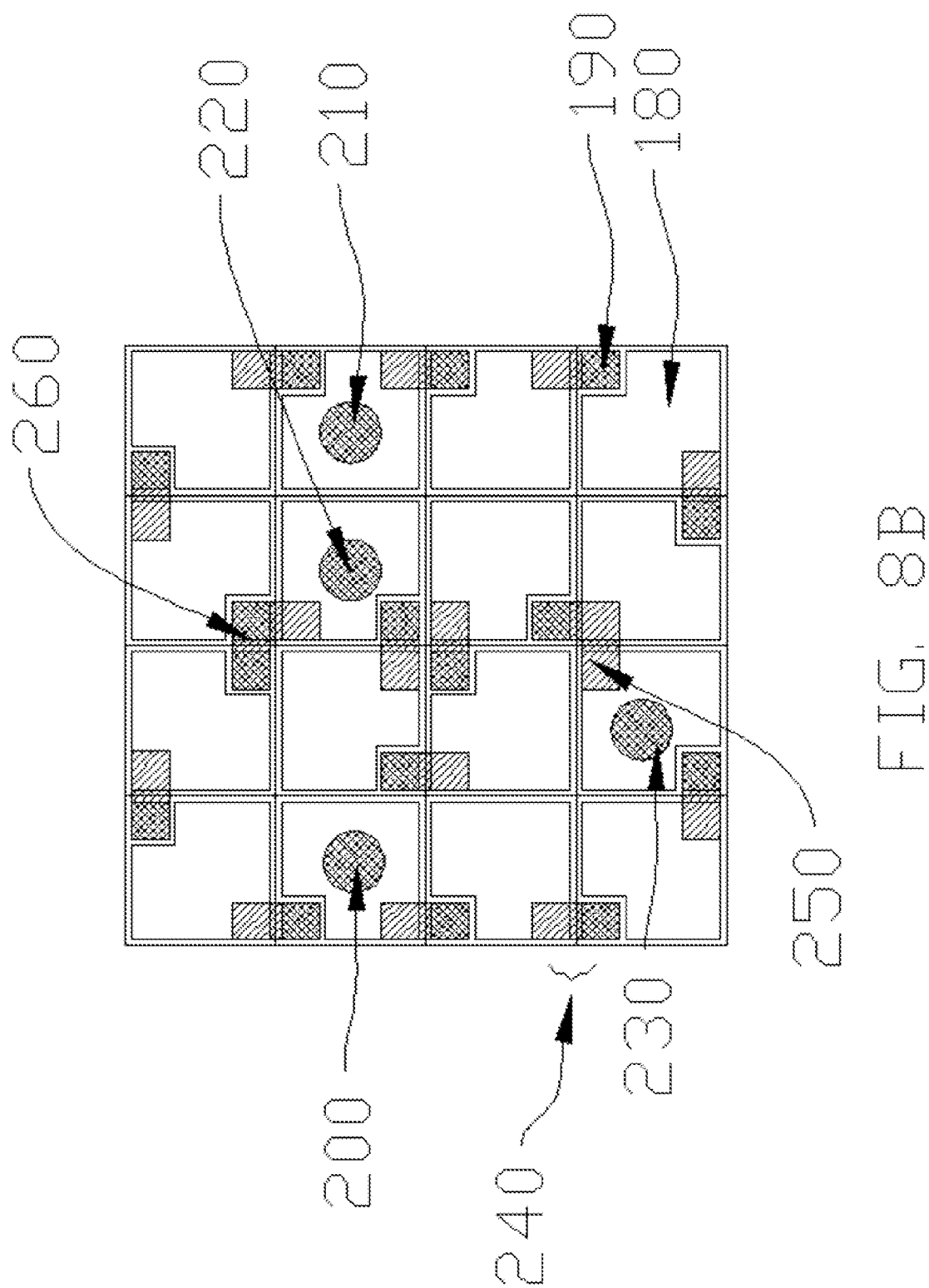
FIG. 8B is an illustration of a plurality of structures of AC LED cells connected in a matrix form according to the equivalent circuit diagram of FIG. 8A.

FIG. 8A illustrates the diode interconnection schematic diagram of sixteen light emitting cells formed into the shape of a square or rectangle in the AC LED device with ten light emitting cells in series mode according to another embodiment of the present invention. FIG. 8B is an illustration of a plurality of structures of AC LED cells connected in a matrix form according to the equivalent circuit diagram of FIG. 8A.

Referring to FIG. 8A, the AC light emitting device has four rectifier branches C1 to C4, each consisting of three light emitting cells connected in series mode with one cell's positive contact being connected to the negative contact of the other cell, and an array of four light emitting cells L1 connected in series mode.

Referring to FIG. 8B, each light emitting cell has a positive contact 180 and a negative contact 190. The positive-to-negative bridge 240 is used to connect the positive contact of one cell to the negative contact of an adjacent cell in each rectifier branch C1 to C4 and in the fifth cell array L1. The negative contact of the last cell in branch C1 is connected to the negative contact of the last cell in branch C3 through the negative-to-negative bridge 260, which is then connected to the positive contact of the first light emitting cell in array L1. The positive contact of the first cell in branch C2 is connected to the positive contact of the first cell in branch C4 through a positive-to-positive bridge 250, which is then connected to the negative contact of the last light emitting cell in array L1. The positive electrode of the external AC voltage source is connected to the positive contact 200 of the first light emitting cell in the rectifier branch C1, and the negative electrode of the external AC voltage source is connected to the negative contact 210 of the last cell in the rectifier branch C2, which is electrically connected to the positive contact of the first cell in the rectifier branch C3 through a positive-to-negative bridge 240. All sixteen light emitting cells in the AC LED device have the same structure and the same light emitting area. The contacts 220 on the positive electrode of the first cell in the array L1 and the contact 230 on the positive electrode of the first cell of branch C2 or C4 provide electric connection for an optional capacitor to reduce voltage ripples across light emitting cell array L1.

Ten light emitting cells are connected in series mode in the AC LED device. For a light emitting cell with an operating voltage between 2.9 and 3.5V, the operating AC voltage of device is between 29 and 35V. During LED operation, ten of the light emitting cells are energized by the positive voltage sweep of the AC voltage source, while the other six are negatively biased and do not generate any light. The light emitting cell utilization rate is 62.5% for the layout design of the invention illustrated in FIG. 8A and FIG. 8B.

Figure 9A:
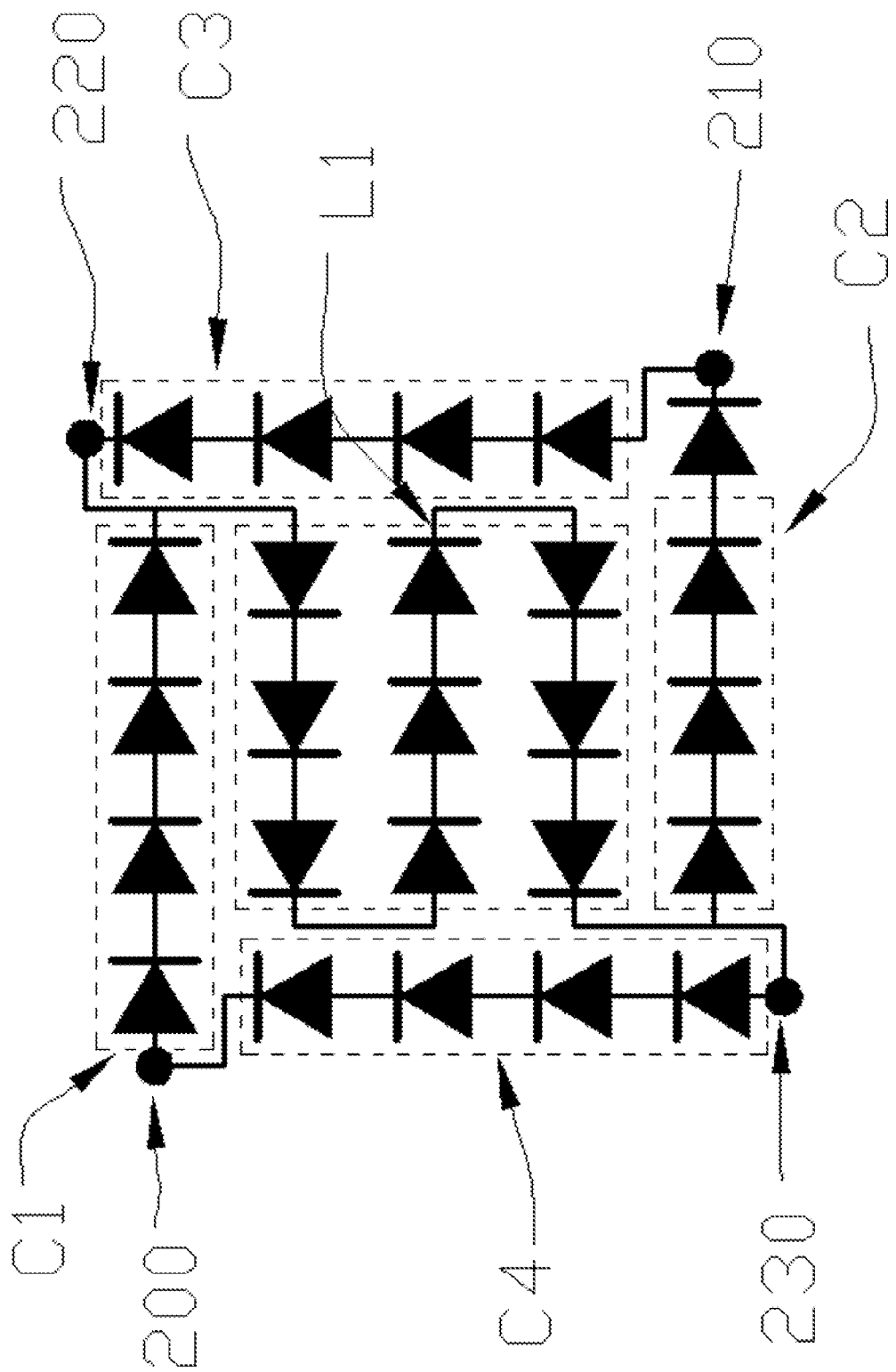
FIG. 9A is the second variation of diode interconnection schematic diagram of the AC LED device with 17 emitting cells in series mode according to the embodiment of the present invention.
Figure 9B:
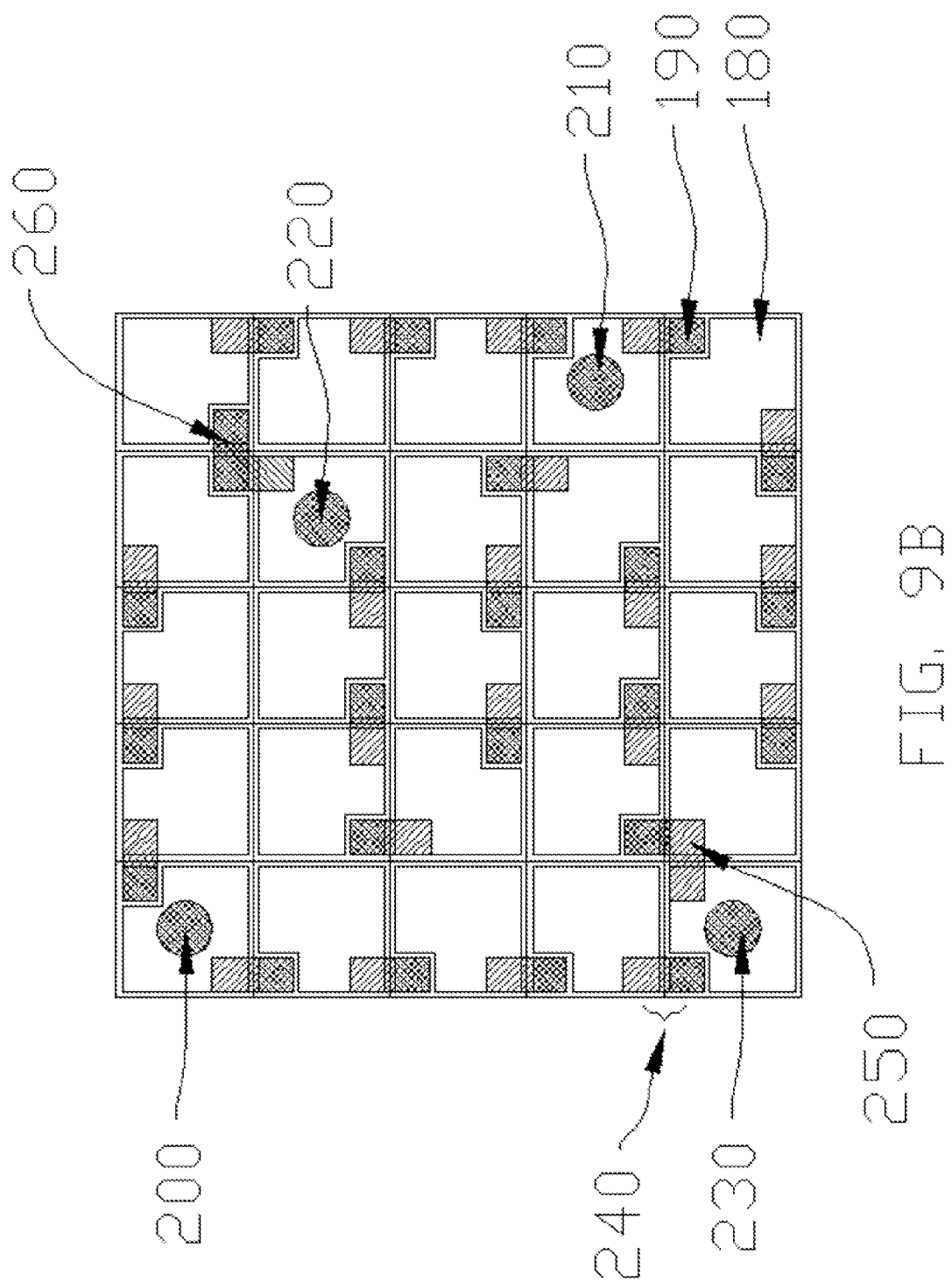
FIG. 9B is an illustration of a plurality of structures of AC LED cells connected in a matrix form according to the equivalent circuit diagram of FIG. 9A. This layout design can be directly connected to AC voltage source of 55V, or two of them in series mode for connection directly to 110V AC power source, or four of them for 220V AC power source.

FIG. 9A illustrates the diode interconnection schematic diagram of twenty-five light emitting cells formed into the shape of a square or rectangle in the AC LED device with seventeen light emitting cells in series mode according to another embodiment of the present invention. FIG. 9B is an illustration of a plurality of structures of AC LED cells connected in a matrix form according to the equivalent circuit diagram of FIG. 9A.

Referring to FIG. 9A, the AC light emitting device has four rectifier branches C1 to C4, each consisting of four light emitting cells connected in series mode with one cell's positive contact being connected to the negative contact of the other cell, and an array of nine light emitting cells L1 in series mode.

Referring to FIG. 9B, each light emitting cell has a positive contact 180 and a negative contact 190. The positive-to-negative bridge 240 is used to connect the positive contact of one cell to the negative contact of an adjacent cell in each rectifier branch C1 to C4 and in the fifth cell array L1. The negative contact of the last cell in branch C1 is connected to the negative contact of the last cell in branch C3 through the negative-to-negative bridge 260, which is then connected to the positive contact of the first light emitting cell in array L1. The positive contact of the first cell in branch C2 is connected to the positive contact of the first cell in branch C4 through a positive-to-positive bridge 250, which is then connected to the negative contact of the last light emitting cell in array L1. The positive electrode of the external AC voltage source is connected to the positive contact 200 of the first light emitting cell in the rectifier branch C1, and the negative electrode of the external AC voltage source is connected to the negative contact 210 of the last cell in the rectifier branch C2, which is electrically connected to the positive contact of the first cell in the rectifier branch C3 through a positive-to-negative bridge 240. All twenty-five light emitting cells in the AC LED device have the same structure and the same light emitting area. The contacts 220 on the positive electrode of the first cell in the array L1 and the contact 230 on the positive electrode of the first cell of branch C2 or C4 provide electric connection for an optional capacitor to reduce voltage ripples across light emitting cell array L1.

Seventeen light emitting cells are connected in series mode in the AC LED device. For a light emitting cell with an operating voltage between 2.9 and 3.5V, the operating AC voltage of the device is between 49.3 and 59.5V. Two AC light emitting units in series mode are suitable for AC line voltage between 110 and 120V. Four AC light emitting units in series mode are suitable for AC line voltage between 220 and 240V. During LED operation, seventeen of the light emitting cells are energized by the positive voltage sweep of the AC voltage source, while the other eight are negatively biased and do not generate any light. The light emitting cell utilization rate is 68% for the layout design of the invention illustrated in FIG. 9A and FIG. 9B.

Figure 10A:
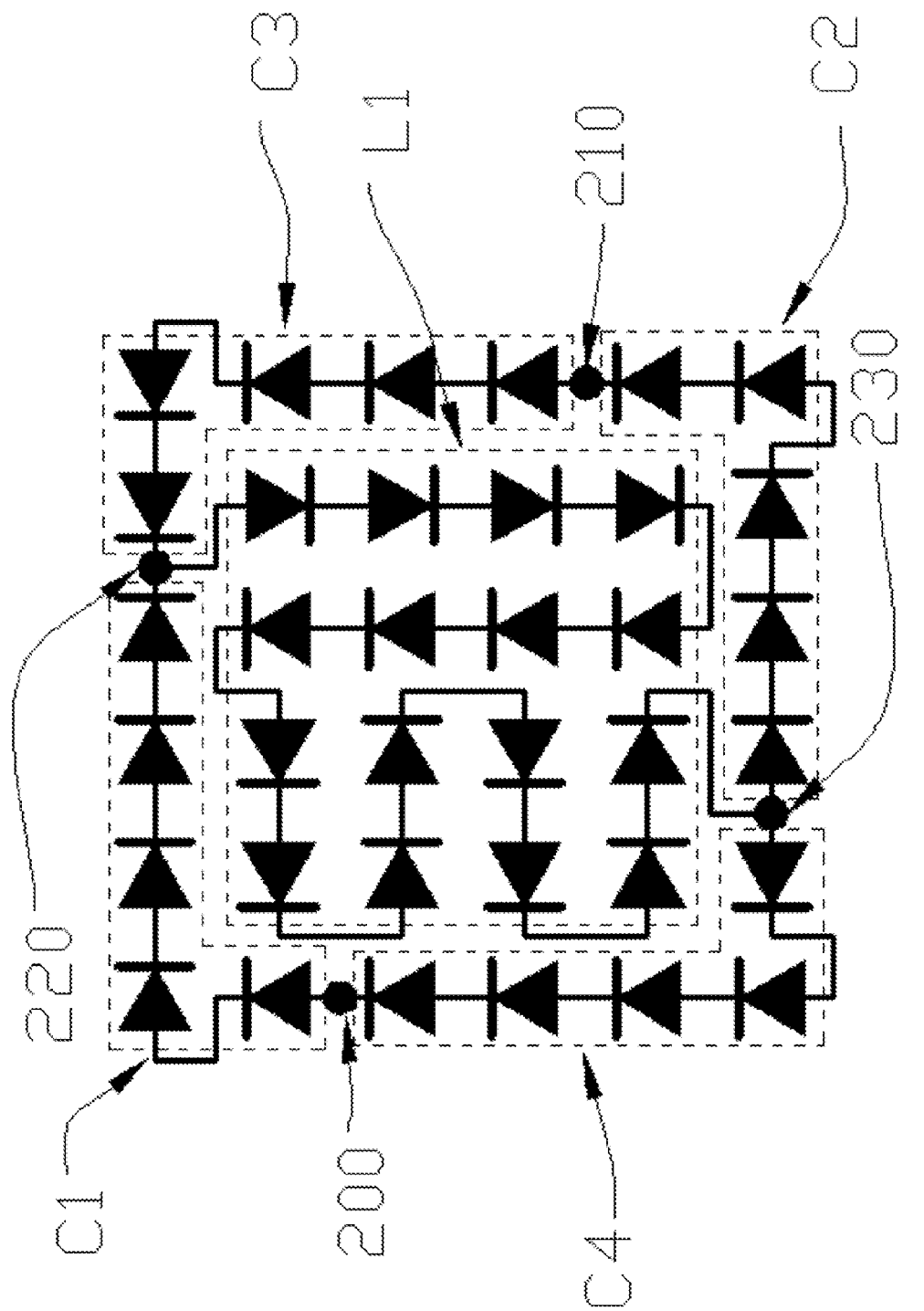
FIG. 10A is the third variation of the diode interconnection schematic diagram of the AC LED device with 26 emitting cells in series mode according to the embodiment of the present invention.
Figure 10B:
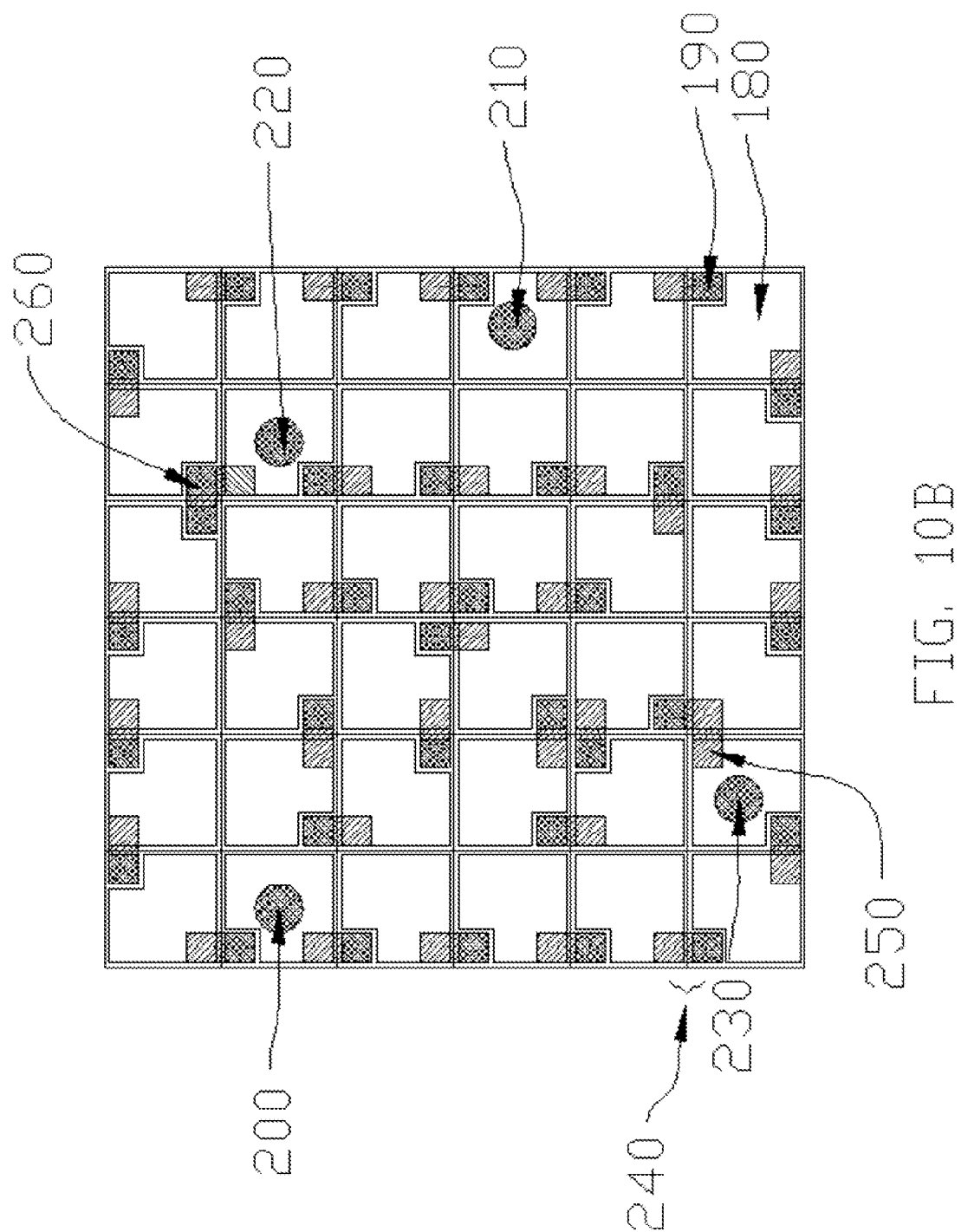
FIG. 10B is an illustration of a plurality of structures of AC LED cells connected in a matrix form according to the equivalent circuit diagram of FIG. 10A.

FIG. 10A illustrates the diode interconnection schematic diagram of thirty-six light emitting cells formed into the shape of a square or rectangle in the AC LED device with twenty-six light emitting cells in series mode according to another embodiment of the present invention. FIG. 10B is an illustration of a plurality of structures of AC LED cells connected in a matrix form according to the equivalent circuit diagram of FIG. 10A.

Referring to FIG. 10A, the AC light emitting device has four rectifier branches C1 to C4, each consisting of five light emitting cells connected in series mode with one cell's positive contact being connected to the negative contact of the other cell, and an array of sixteen light emitting cells L1 connected in series mode.

Referring to FIG. 10B, each light emitting cell has a positive contact 180 and a negative contact 190. The positive-to-negative bridge 240 is used to connect the positive contact of one cell to the negative contact of an adjacent cell in each rectifier branch C1 to C4 and in the fifth cell array L1. The negative contact of the last cell in branch C1 is connected to the negative contact of the last cell in branch C3 through the negative-to-negative bridge 260, which is then connected to the positive contact of the first light emitting cell in array L1. The positive contact of the first cell in branch C2 is connected to the positive contact of the first cell in branch C4 through a positive-to-positive bridge 250, which is then connected to the negative contact of the last light emitting cell in array L1. The positive electrode of the external AC voltage source is connected to the positive contact 200 of the first light emitting cell in the rectifier branch C1, and the negative electrode of the external AC voltage source is connected to the negative contact 210 of the last cell in the rectifier branch C2, which is electrically connected to the positive contact of the first cell in the rectifier branch C3 through a positive-to-negative bridge 240. All thirty-six light emitting cells in the AC LED device have the same structure and the same light emitting area. The contacts 220 on the positive electrode of the first cell in the array L1 and the contact 230 on the positive electrode of the first cell of branch C2 or C4 provide electric connection for an optional capacitor to reduce voltage ripples across light emitting cell array L1.

Twenty-six light emitting cells are connected in series mode in the AC LED device. For a light emitting cell with an operating voltage between 2.9 and 3.5V, the operating AC voltage of the device is between 75.4 and 91V. During LED operation, twenty-six of the light emitting cells are energized by the positive voltage sweep of the AC voltage source, while the other ten are negatively biased and do not generate any light. The light emitting cell utilization rate is 72.2% for the layout design of the invention illustrated in FIG. 10A and FIG. 10B.

Figure 11A:
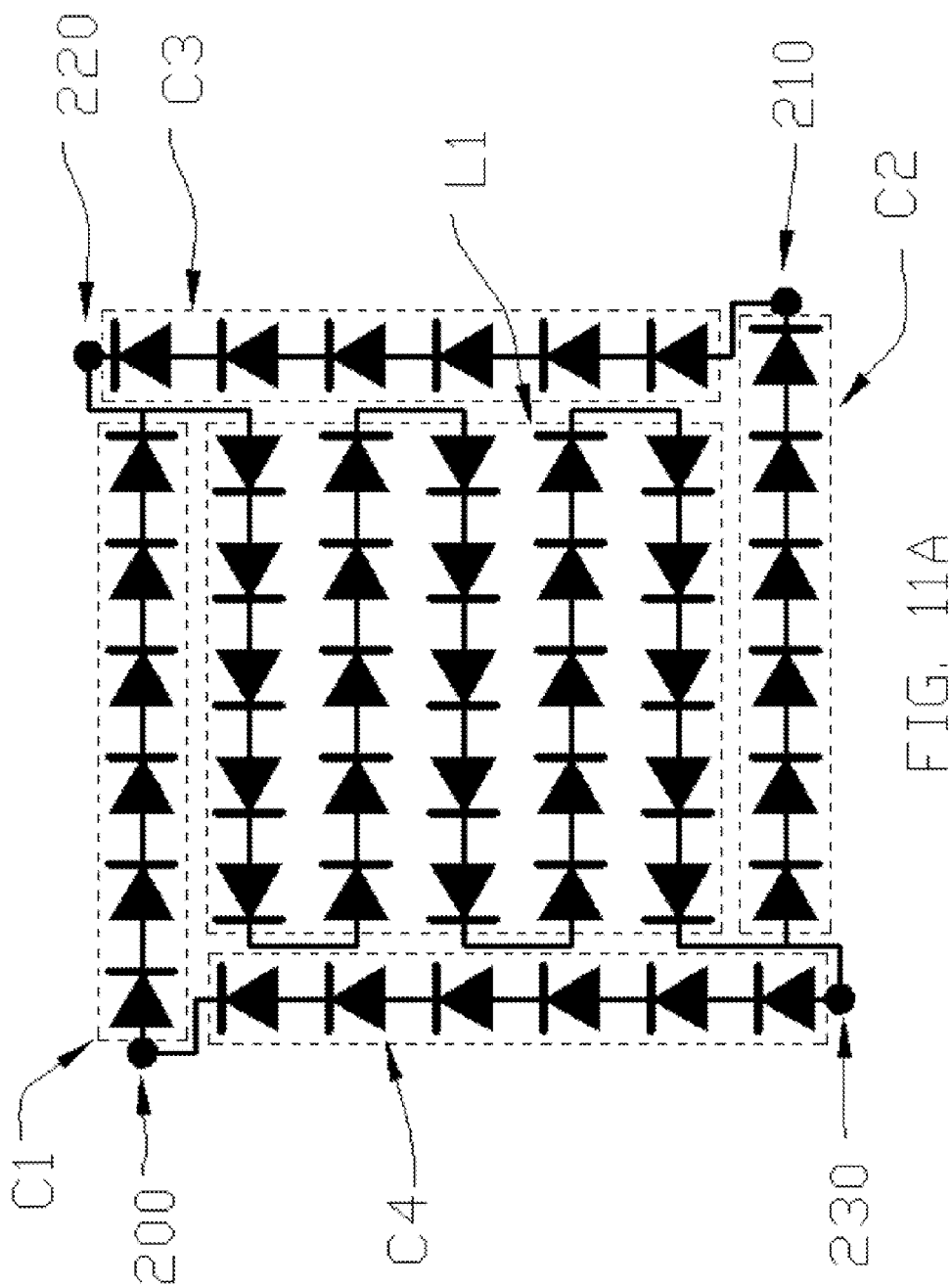
FIG. 11A is the fourth variation of diode interconnection schematic diagram of the AC LED device with 37 emitting cells in series mode according to the embodiment of the present invention.
Figure 11B:
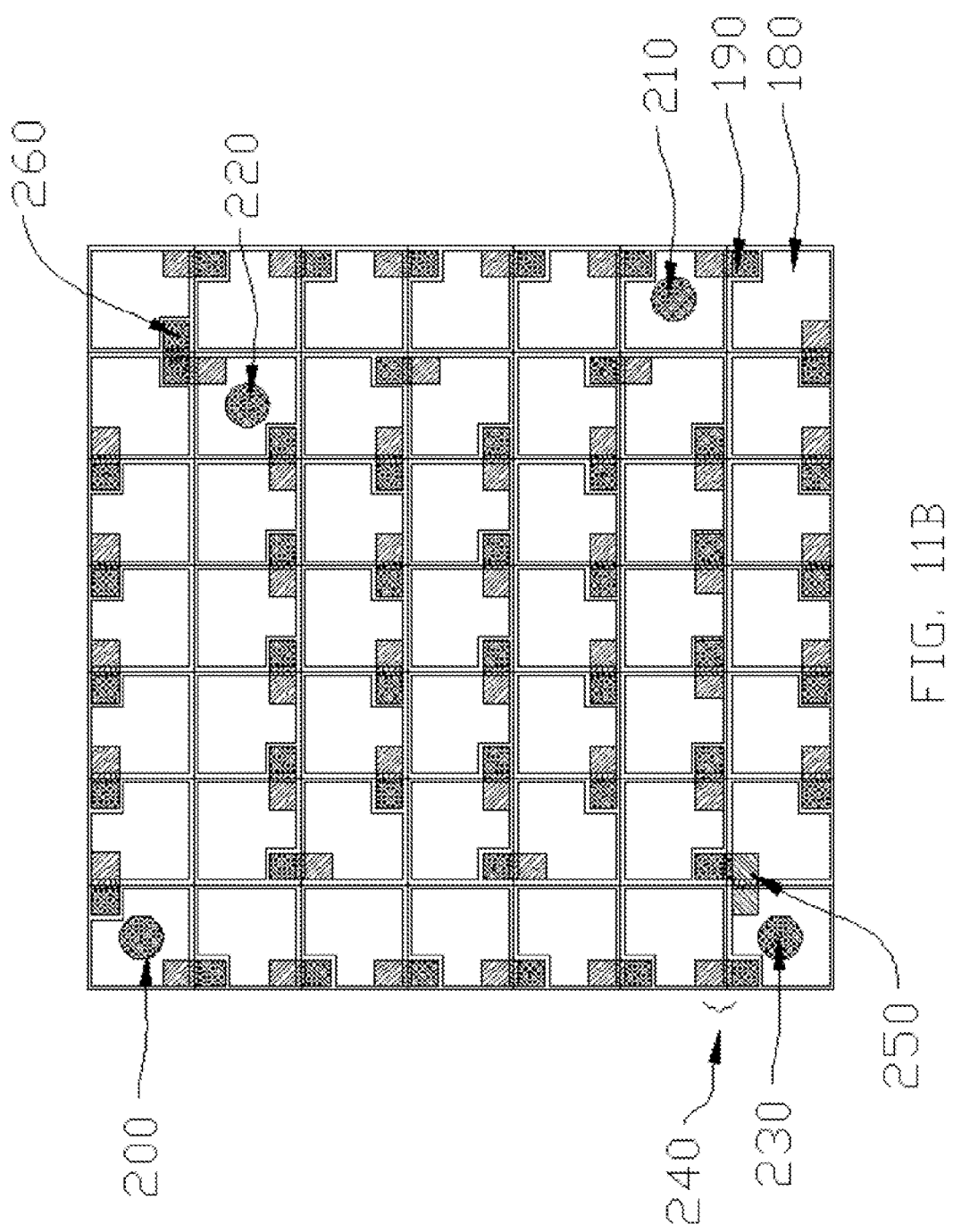
FIG. 11B is an illustration of a plurality of structures of AC LED cells connected in a matrix form according to the equivalent circuit diagram of FIG. 11A. The AC device's operating voltage is between 110 and 120V AC, or two of them in series mode for connection to AC voltage between 220 and 240V.

FIG. 11A illustrates the diode interconnection schematic diagram of forty-nine light emitting cells formed into the shape of a square or rectangle in the AC LED device with thirty-seven light emitting cells in series mode according to another embodiment of the present invention. FIG. 11B is an illustration of a plurality of structures of AC LED cells connected in a matrix form according to the equivalent circuit diagram of FIG. 11A.

Referring to FIG. 11A, the AC light emitting device has four rectifier branches C1 to C4, each consisting of six light emitting cells connected in series mode with one cell's positive contact being connected to the negative contact of the other cell, and an array of twenty-five light emitting cells L1 connected in series mode.

Referring to FIG. 11B, each light emitting cell has a positive contact 180 and a negative contact 190. The positive-to-negative bridge 240 is used to connect the positive contact of one cell to the negative contact of an adjacent cell in each rectifier branch C1 to C4 and in the fifth cell array L1. The negative contact of the last cell in branch C1 is connected to the negative contact of the last cell in branch C3 through the negative-to-negative bridge 260, which is then connected to the positive contact of the first light emitting cell in array L1. The positive contact of the first cell in branch C2 is connected to the positive contact of the first cell in branch C4 through a positive-to-positive bridge 250, which is then connected to the negative contact of the last light emitting cell in array L1. The positive electrode of the external AC voltage source is connected to the positive contact 200 of the first light emitting cell in the rectifier branch C1, and the negative electrode of the external AC voltage source is connected to the negative contact 210 of the last cell in the rectifier branch C2, which is electrically connected to the positive contact of the first cell in the rectifier branch C3 through a positive-to-negative bridge 240. All forty-nine light emitting cells in the AC LED device have the same structure and the same light emitting area. The contacts 220 on the positive electrode of the first cell in the array L1 and the contact 230 on the positive electrode of the first cell of branch C2 or C4 provide electric connection for an optional capacitor to reduce voltage ripples across light emitting cell array L1.

Thirty-seven light emitting cells are connected in series mode in the AC LED device. For a light emitting cell with an operating voltage between 2.9 and 3.5V, the operating AC voltage of the device is between 107.3 and 129.5V. One AC light emitting unit is suitable for AC line voltage between 110 and 120V. Two AC light emitting units in series mode are suitable for AC line voltage between 220 and 240V. During LED operation, thirty-seven of the light emitting cells are energized by the positive voltage sweep of the AC voltage source, while the other twelve are negatively biased and do not generate any light. The light emitting cell utilization rate is 75.5% for the layout design of the invention illustrated in FIG. 11A and FIG. 11B.

Figure 12A:
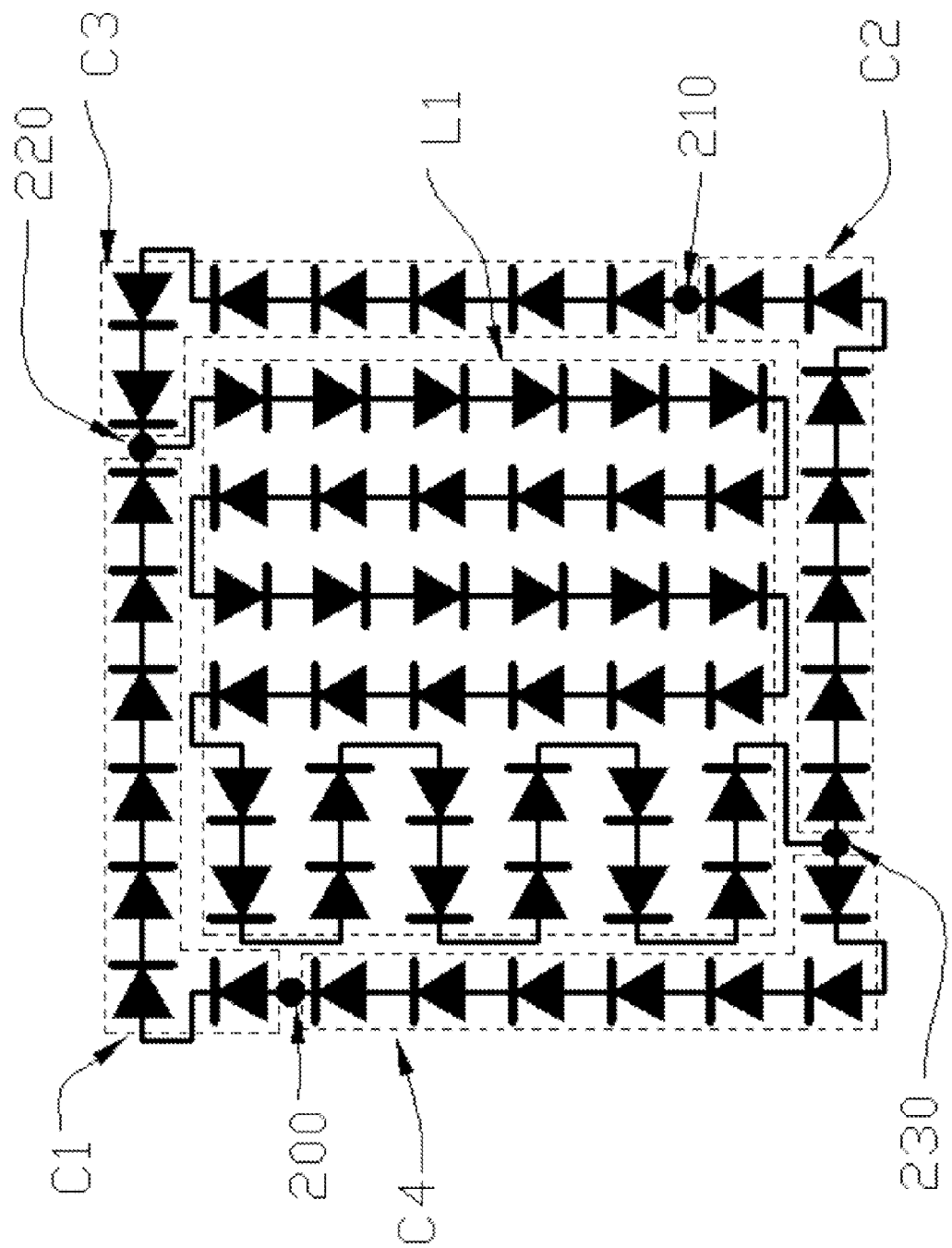
FIG. 12A is the fifth variation of diode interconnection schematic diagram of the AC LED device with 50 emitting cells in series mode according to the embodiment of the present invention.
Figure 12B:
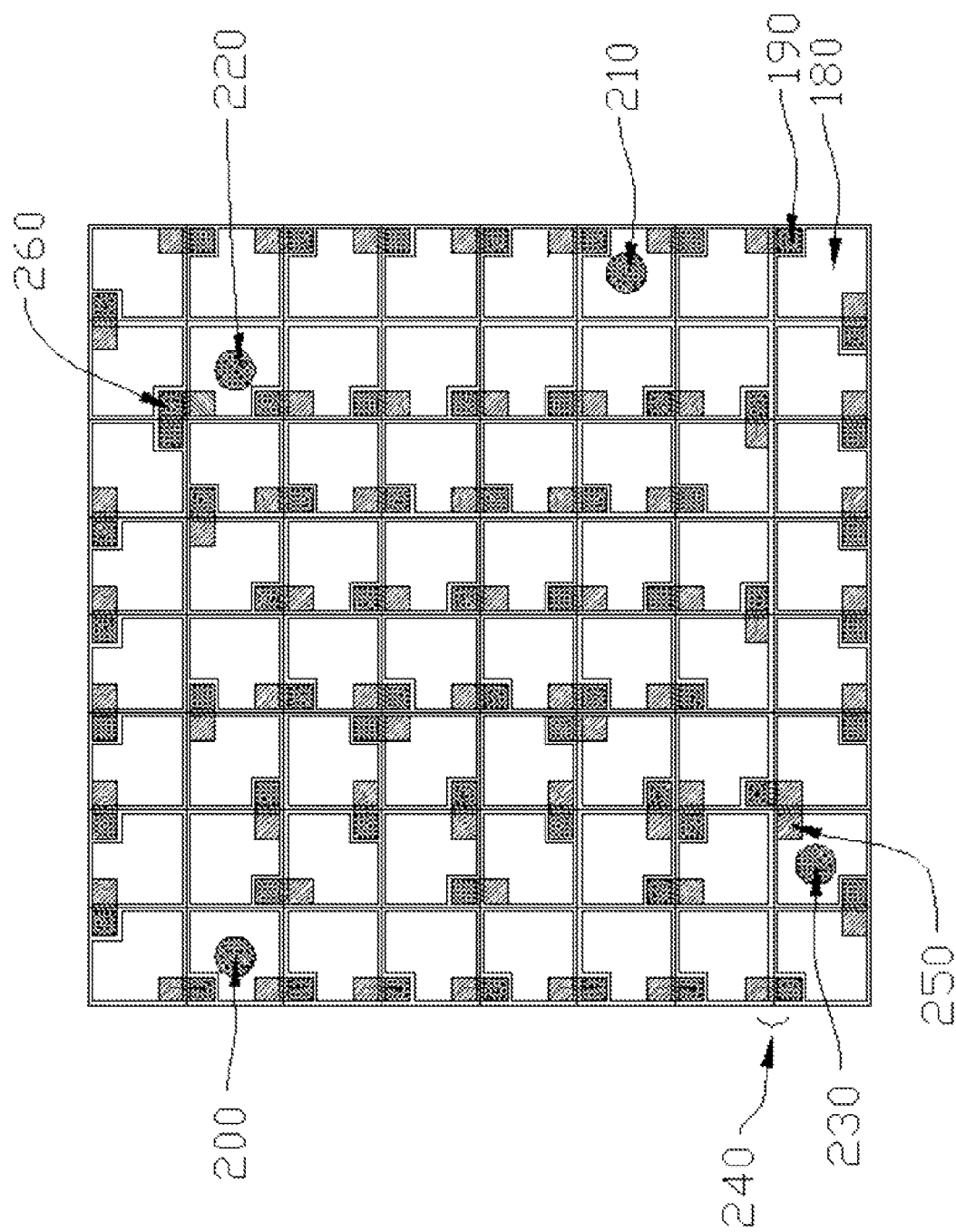
FIG. 12B is an illustration of a plurality of structures of AC LED cells connected in a matrix form according to the equivalent circuit diagram of FIG. 12A.

FIG. 12A illustrates the diode interconnection schematic diagram of sixty-four light emitting cells formed into the shape of a square or rectangle in the AC LED device with fifty light emitting cells in series mode according to another embodiment of the present invention. FIG. 12B is an illustration of a plurality of structures of AC LED cells connected in a matrix form according to the equivalent circuit diagram of FIG. 12A.

Referring to FIG. 12A, the AC light emitting device has four rectifier branches C1 to C4, each consisting of seven light emitting cells connected in series mode with one cell's positive contact being connected to the negative contact of the other cell, and an array of thirty-six light emitting cells L1 connected in series mode.

Referring to FIG. 12B, each light emitting cell has a positive contact 180 and a negative contact 190. The positive-to-negative bridge 240 is used to connect the positive contact of one cell to the negative contact of an adjacent cell in each rectifier branch C1 to C4 and in the fifth cell array L1. The negative contact of the last cell in branch C1 is connected to the negative contact of the last cell in branch C3 through the negative-to-negative bridge 260, which is then connected to the positive contact of the first light emitting cell in array L1. The positive contact of the first cell in branch C2 is connected to the positive contact of the first cell in branch C4 through a positive-to-positive bridge 250, which is then connected to the negative contact of the last light emitting cell in array L1. The positive electrode of the external AC voltage source is connected to the positive contact 200 of the first light emitting cell in the rectifier branch C1, and the negative electrode of the external AC voltage source is connected to the negative contact 210 of the last cell in the rectifier branch C2, which is electrically connected to the positive contact of the first cell in the rectifier branch C3 through a positive-to-negative bridge 240. All sixty-four light emitting cells in the AC LED device have the same structure and the same light emitting area. The contacts 220 on the positive electrode of the first cell in the array L1 and the contact 230 on the positive electrode of the first cell of branch C2 or C4 provide electric connection for an optional capacitor to reduce voltage ripples across light emitting cell array L1.

Fifty light emitting cells are connected in series mode in the AC LED device. For a light emitting cell with an operating voltage between 2.9 and 3.5V, the operating AC voltage of the device is between 145 and 175V. During LED operation, fifty of the light emitting cells are energized by the positive voltage sweep of the AC voltage source, while the other fourteen are negatively biased and do not generate any light. The light emitting cell utilization rate is 78.1% for the layout design of the invention illustrated in FIG. 12A and FIG. 12B.

FIG. 13A illustrates the diode interconnection schematic diagram of eighty-one light emitting cells formed into a square or rectangle in the AC LED device with sixty-five light emitting cells in series mode according to another embodiment of the present invention.

Figure 13B:
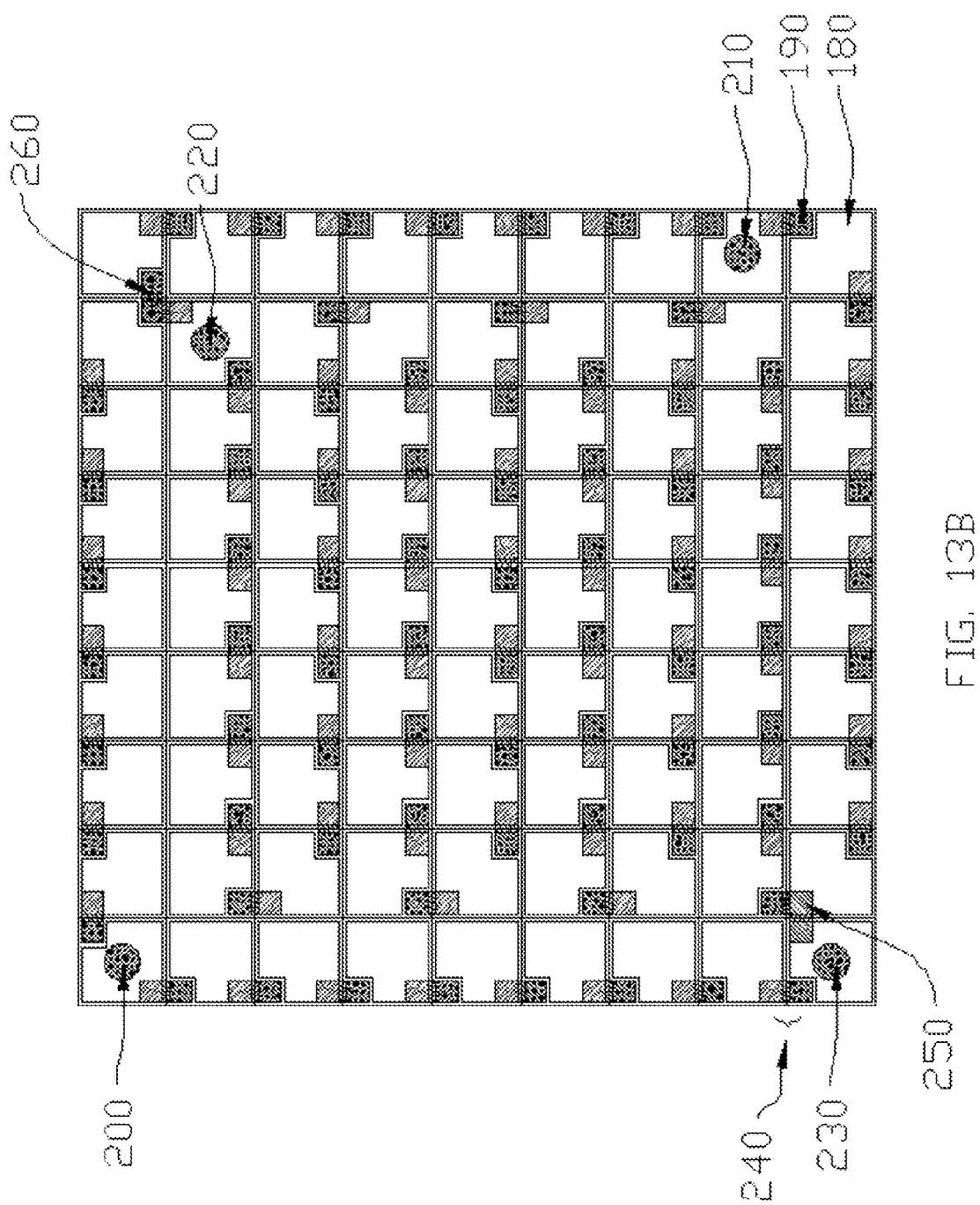

FIG. 13B is an illustration of a plurality of structures of AC LED cells connected in a matrix form according to the equivalent circuit diagram of FIG. 13A.

Referring to FIG. 13A, the AC light emitting device has four rectifier branches C1 to C4, each consisting of eight light emitting cells connected in series mode with one cell's positive contact being connected to the negative contact of the other cell and an array of forty-nine light emitting cells L1 connected in series mode.

Referring to FIG. 13B, each light emitting cell has a positive contact 180 and a negative contact 190. The positive-to-negative bridge 240 is used to connect the positive contact of one cell to the negative contact of an adjacent cell in each rectifier branch C1 to C4 and in the fifth cell array L1. The negative contact of the last cell in branch C1 is connected to the negative contact of the last cell in branch C3 through the negative-to-negative bridge 260, which is then connected to the positive contact of the first light emitting cell in array L1. The positive contact of the first cell in branch C2 is connected to the positive contact of the first cell in branch C4 through a positive-to-positive bridge 250, which is then connected to the negative contact of the last light emitting cell in array L1. The positive electrode of the external AC voltage source is connected to the positive contact 200 of the first light emitting cell in the rectifier branch C1, and the negative electrode of the external AC voltage source is connected to the negative contact 210 of the last cell in the rectifier branch C2, which is electrically connected to the positive contact of the first cell in the rectifier branch C3 through a positive-to-negative bridge 240. All eighty-one light emitting cells in the AC LED device have the same structure and the same light emitting area. The contacts 220 on the positive electrode of the first cell in the array L1 and the contact 230 on the positive electrode of the first cell of branch C2 or C4 provide electric connection for an optional capacitor to reduce voltage ripples across light emitting cell array L1.

Sixty-five light emitting cells are connected in series mode in the AC LED device. For a light emitting cell with an operating voltage between 2.9 and 3.5V, the operating AC voltage of the device is between 188.5 and 227.5V. One AC light emitting device is suitable for 220V AC line voltage. During LED operation, sixty-five of the light emitting cells are energized by the positive voltage sweep of the AC voltage source, while the other sixteen are negatively biased and do not generate any light. The light emitting cell utilization rate is 80.2% for the layout design of the invention illustrated in FIG. 13A and FIG. 13B.

FIG. 14A illustrates the diode interconnection schematic diagram of fifty light emitting cells formed into the shape a rectangle in the AC LED device with thirty-eight light emitting cells in series mode according to another embodiment of the present invention. FIG. 14B is an illustration of a plurality of structures of AC LED cells connected in a matrix form according to the equivalent circuit diagram of FIG. 14A.

Referring to FIG. 14A, the AC light emitting device has four rectifier branches C1 to C4, each consisting of six light emitting cells connected in series mode with one cell's positive contact being connected to the negative contact of the other cell, and an array of twenty-six light emitting cells L1 connected in series mode.

Referring to FIG. 14B, each light emitting cell has a positive contact 180 and a negative contact 190. The positive-to-negative bridge 240 is used to connect the positive contact of one cell to the negative contact of an adjacent cell in each rectifier branch C1 to C4 and in the fifth cell array L1. The negative contact of the last cell in branch C1 is connected to the negative contact of the last cell in branch C3 through the positive metal contact of the first cell in array L1. The last cell in array L1 is different from the other cells in the AC device and has the n-contact shape of the cell illustrated in FIG. 4B. The positive contact of the first cell in branch C2 is connected to the positive contact of the first cell in branch C4 through the n-type GaN of the last cell in array L1. The positive electrode of the external AC voltage source is connected to the positive contact 200 of the first light emitting cell in the rectifier branch C1, and the negative electrode of the external AC voltage source is connected to the negative contact 210 of the last cell in the rectifier branch C2, which is electrically connected to the positive contact of the first cell in the rectifier branch C3 through a positive-to-negative bridge 240. All fifty light emitting cells in the AC LED device have the same light emitting area and one of them has a different n-type contact structure. The contacts 220 on the positive electrode of the first cell in the array L1 and the contact 230 on the positive electrode of the first cell of branch C2 or C4 provide electric connection for an optional capacitor to reduce voltage ripples across light emitting cell array L1.

Thirty-eight light emitting cells are connected in series mode in the AC LED device. For a light emitting cell with an operating voltage between 2.9 and 3.5V, the operating AC voltage of the device is between 110.2 and 133V. One AC light emitting unit is suitable for AC line voltage between 110 and 120V. Two AC light emitting units in series mode are suitable for AC line voltage between 220 and 240V. During LED operation, thirty-eight of the light emitting cells are energized by the positive voltage sweep of the AC voltage source, while the other twelve are negatively biased and do not generate any light. The light emitting cell utilization rate is 76% for the layout design of the invention illustrated in FIG. 14A and FIG. 14B.

FIG. 15A illustrates the diode interconnection schematic diagram of forty-five light emitting cells formed into a rectangle in the AC LED device with thirty-three light emitting cells in series mode according to another embodiment of the present invention. FIG. 15B is an illustration of a plurality of structures of AC LED cells connected in a matrix form according to the equivalent circuit diagram of FIG. 15A.

Referring to FIG. 15A, the AC light emitting device has four rectifier branches C1 to C4, each consisting of six light emitting cells connected in series mode with one cell's positive contact being connected to the negative contact of the other cell, and an array of twenty-one light emitting cells L1 connected in series mode.

Referring to FIG. 15B, each light emitting cell has a positive contact 180 and a negative contact 190. The positive-to-negative bridge 240 is used to connect the positive contact of one cell to the negative contact of an adjacent cell in each rectifier branch C1 to C4 and in the fifth cell array L1. The negative contact of the last cell in branch C1 is connected to the negative contact of the last cell in branch C3 through the negative-to-negative bridge 260, which is then connected to the positive contact of the first light emitting cell in array L1. The positive contact of the first cell in branch C2 is connected to the positive contact of the first cell in branch C4 through a positive-to-positive bridge 250, which is then connected to the negative contact of the last light emitting cell in array L1. The positive electrode of the external AC voltage source is connected to the positive contact 200 of the first light emitting cell in the rectifier branch C1, and the negative electrode of the external AC voltage source is connected to the negative contact 210 of the last cell in the rectifier branch C2, which is electrically connected to the positive contact of the first cell in the rectifier branch C3 through a positive-to-negative bridge 240. All forty-five light emitting cells in the AC LED device have the same structure and the same light emitting area. The contacts 220 on the positive electrode of the first cell in the array L1 and the contact 230 on the positive electrode of the first cell of branch C2 or C4 provide electric connection for an optional capacitor to reduce voltage ripples across light emitting cell array L1.

Thirty-three light emitting cells are connected in series mode in the AC LED device. For a light emitting cell with an operating voltage between 2.9 and 3.5V, the operating AC voltage of the device is between 95.7 and 115.5V. One AC light emitting unit is suitable for AC line voltage between 110 and 120V. Two AC light emitting units in series mode are suitable for AC line voltage between 220 and 240V. During LED operation, thirty-three of the light emitting cells are energized by the positive voltage sweep of the AC voltage source, while the other twelve are negatively biased and do not generate any light. The light emitting cell utilization rate is 73.3% for the layout design of the invention illustrated in FIG. 15A and FIG. 15B.

The AC LED cell layouts are not limited to the aforementioned embodiments, but may be implemented in other forms or used with a combination of the layouts in FIG. 6 to FIG. 15 by those skilled in the art to match light emitting cell's operating voltage to the external AC power voltage.

The present invention further provides a new fabrication process flow for the AC light emitting device as shown in FIG. 16A through FIG. 16E. To correspond with the aforementioned embodiments, the fabrication method thereof is exemplified by the drawing to illustrate the fabrication process of the AC light emitting device based on GaN on transparent sapphire substrate.

Figure 16A:
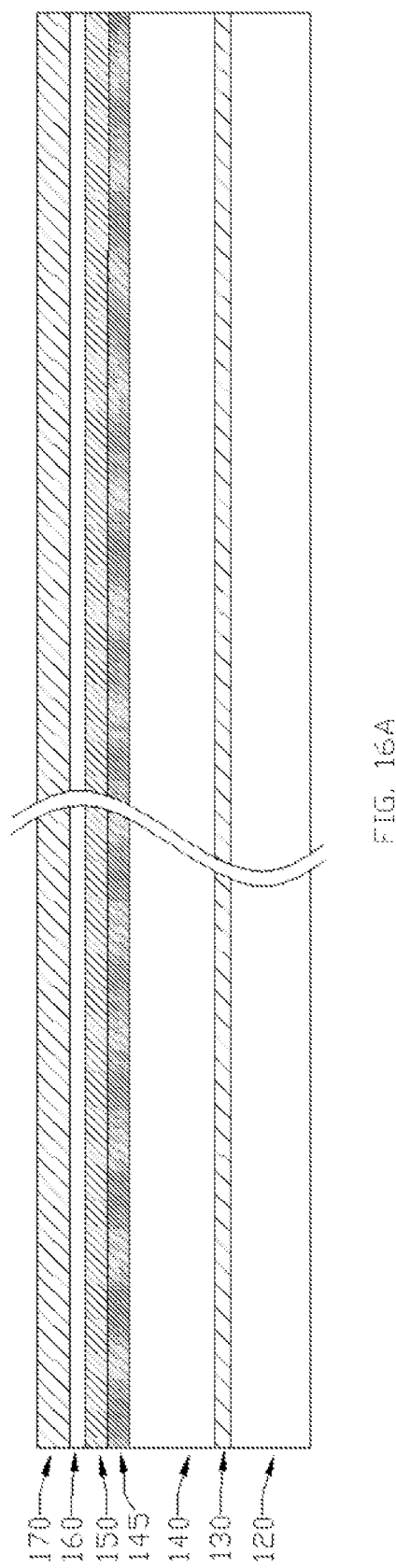

Referring to FIG. 16A, the fabrication method comprises the steps of preparing the substrate 120 and forming a low temperature undoped GaN buffer layer 130, a silicon doped n-type GaN layer 140, a stress release super lattice layer 145, an active layer 150, a magnesium doped p-type AlGaN layer 160, and a magnesium doped p-type GaN layer 170, wherein the active layer 150 is composed of multiple undoped InGaN well layer and GaN barrier layer stacked on top of each other and located between the n-type GaN and p-type AlGaN and GaN layers.

Figure 16B:
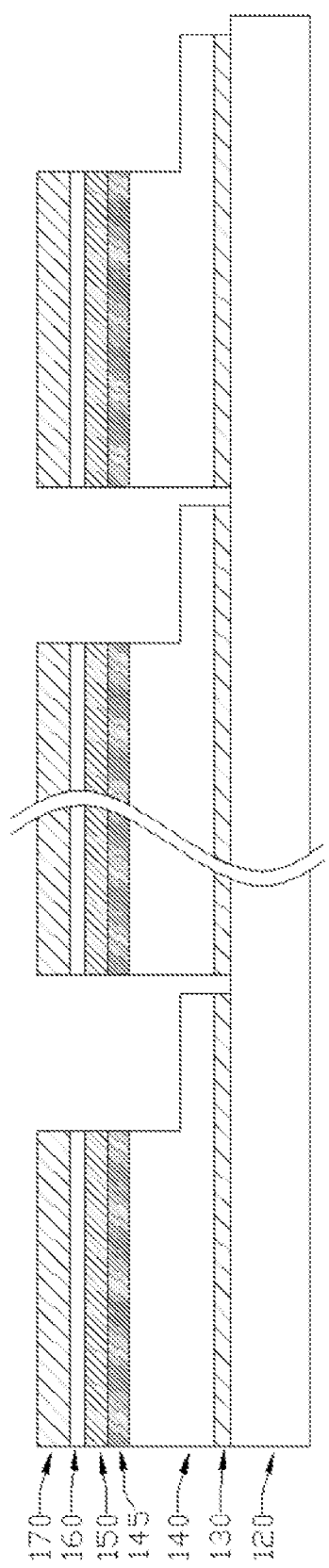

A plurality of openings are then formed to isolate light emitting cells from their neighbors through the first photo-lithography patterning and dry or wet etch process to remove GaN and other layers on the substrate so the substrate is exposed without residual as-deposited materials. The n-type GaN surface is then partially exposed through the second photo-lithography patterning and dry or wet etch process to remove all the stack of layers above n-type GaN layer and also some of the n-type GaN layer. The final cross sectional view of the wafer and layer stack is shown in FIG. 16B.

The substrate with a plurality of openings are then covered with a layer of insulation and protective materials, consisting of dielectrics, such as silicon oxide or silicon nitride layers or a combination of silicon oxide and silicon nitride layers, to prevent leakage of current between n-type and p-type GaN layers and also to stop current leakage between adjacent light emitting cells. Subsequently, both p-type and n-type GaN surface are exposed through the third lithography patterning and dry or wet etch of the protective layer process, as shown in FIG. 16C. The isolation layer 195 is formed on the side wall of the light emitting cell with exposed substrate surface to isolate each light emitting cell from its adjacent cells. The isolation layer 185 is formed on the side wall of the light emitting cell with exposed n-type GaN layer to prevent n-type electrode metal to short all other layers located above the n-type GaN layer.

After the isolation layer 185 and 195 are patterned and prepared, a thick layer of conductive materials, being a stack of metal layers made of, such as tungsten, titanium, or aluminum, are then deposited through sputtering of the metal target, or evaporation of individual metals or wet solution plating, or a combination of the techniques aforementioned, in order to establish electric connection from negative electrode of one light emitting cell to the positive electrode of another cell, and also to provide p-type and n-type electric connection to external power sources. The as-deposited metal layer then undergo the fourth lithography patterning and dry etch process for the individual light emitting cells to be connected and isolated according to the pre-designed AC light emitting device layout of the aforementioned embodiments of the present invention. As shown in FIG. 16D, the etch of metal layer down to isolation layer 185 separates one light emitting cell from its adjacent cells so the p-type metal electrode 180 and n-type electrode 190 are formed, while the metal layer above isolation layer 195 is not etched. It acts as series connection bridge 240 for the electric connection of positive electrode of one cell to the negative electrode of another cell, and establishes a chain of series connected light emitting cells.

As shown in FIG. 16E, the light emitting device surface is then covered with a layer of passivation silicon oxide or silicon nitride layer 220, followed by the fifth lithography patterning and dry or wet etch process to open the passivation layer for both positive and negative electrode connection to the external AC voltage source. Lastly, the wafer goes through grinding, polishing, and breaking process to form individual AC light emitting device, which will be ready for packaging process.

In summary of the aforementioned embodiments, the AC light emitting device disclosed by the present invention is characterized in that each device has light emitting cells forming four rectifier bridges with light emitting cells in each branch connected in series mode for operations under high voltage external power sources, and a fifth positive biased cell arrays in series mode to generate light during both positive and negative cycles of external AC voltage sweep. Each AC light emitting device takes the shape of a square or a rectangle and is formed from the stacked GaN and other active layers on the transparent sapphire substrate through etching and deposition to isolate and interconnect light emitting cells according the appropriate layout design. Furthermore, the application of the layout design disclosed by the present invention can be modified by those skilled to meet the requirement of different external AC voltages.

The present invention has been described and illustrated using the exemplary preferred embodiments. All modifications and variations of equal functions without violating the principle and technology of the present invention should be included in the scope of the claims as described below.

What is claimed in the present invention is:

1. The light emitting device for use with an alternating current (AC) power source comprising:
    a transparent sapphire substrate;
    a plurality of LED cells monolithically formed on the said sapphire substrate; the LED cell has: (i) an undoped GaN seed layer on top of said sapphire substrate; (ii) a silicon doped n-type GaN layer above said GaN seed layer to act as an n-type semiconductor layer and to form an n-type electrode; (iii) a super lattice layer comprising layers of $In_xGa_{1-x}N$ and GaN alternating above said n-type GaN layer, where x is between 0 and 0.1, $In_xGa_{1-x}N$ and GaN thickness are less than 3 nm, number of $In_xGa_{1-x}N$ and GaN layers are less than 10; (iv) a multiple quantum well (MQW) active layer comprising $In_xGa_{1-x}N$ and GaN alternating above said super lattice layer, where x is between 0.1 and 0.2, $In_xGa_{1-x}N$ and GaN thickness is less than 30 nm, number of $In_xGa_{1-x}N$ and GaN layers are between 5 and 20; (v) a magnesium doped-type AlGaN layer above said MQW layer with thickness less than 150 nm; (vi) a magnesium doped p-type GaN layer above said p-type AlGaN layer; (vii) a conductive metal layer above said p-type GaN;
    wherein the plurality of LED cells are formed into five groups of LED cells formed on the said sapphire substrate; within said each group of LED cells, the p-electrode of the LED cell is connected to the n-electrode of its adjacent cell;
    the p-electrode of the first LED cell of said the first group is connected to a positive electrode of the AC power source and also the n-electrode of the last LED cell of said the fourth group;
    the n-electrode of the last LED cell of said the first group is connected to the p-electrode of the first LED cell of said the fifth group and to the n-electrode of the last LED cell of said the third group;
    the n-electrode of the last LED cell of said the fifth group is connected to the p-electrode of the first cell of said the fourth group and to the p-electrode of the first LED cell of said the second group;
    the n-electrode of the last LED cell of said the second group is connected to a negative electrode of the AC power source and also to the p-electrode of the first cell of said the third group; and
    the interconnection between cells is by a deposited and patterned metal film that occupies a common plane above the LED cells.

2. The light emitting device of claim 1, wherein each light emitting cell consists of a shape of four sides to meet unique monolithic integration requirement; first side is parallel to the first side while the second side is parallel to the fourth side; the angle between said first and said second side is identical to angle between said third side and said fourth side; and the said angle is between 30 and 150 degrees.

3. The light emitting device of claim 1, wherein the n-type GaN layer of said LED cell is exposed on one corner with a shape of a square to be connected to the p-type GaN layer of adjacent LED cell; the p-electrode of said LED cell covers the rest of the top surface area of said LED cell.

4. The light emitting device of claim 1, wherein:
    the light emitting cell in said the light emitting device takes the shape of a parallelogram for monolithically integration with other cells;
    the positive electrode of AC power source is connected to metal layer on top of said the p-type GaN of the first cell of said the first group; the negative electrode of AC power source is connected to metal layer on top of said the n-type GaN of the last cell of said the second group;
    the number of light emitting cells in said group 1 to 4 is at least two while the number of light emitting cells in said group 5 is at least one to match AC power source line voltage.

5. The light emitting device of claim 1, wherein:
    the said light emitting device is a flip-chip device, with p-type GaN covered with metal and light reflection layers; the generated light is emitted from said the transparent sapphire substrate surface.

6. The light emitting device of claim 1, wherein all said light emitting cells in the alternating current light emitting device have the same p-type and n-type electrode area and their light emitting area are identical.

* * * * *